(12) United States Patent
Fujita

(10) Patent No.: US 8,450,625 B2
(45) Date of Patent: May 28, 2013

(54) SWITCH DEVICE AND CIRCUIT INCLUDING SWITCH DEVICE

(75) Inventor: Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/421,314

(22) Filed: Mar. 15, 2012

(65) Prior Publication Data
US 2012/0168290 A1 Jul. 5, 2012

Related U.S. Application Data

(63) Continuation of application No. PCT/JP2009/066805, filed on Sep. 28, 2009.

(51) Int. Cl.
*H01H 57/00* (2006.01)

(52) U.S. Cl.
USPC ............................ 200/181; 200/600; 977/732

(58) Field of Classification Search
USPC ................................... 200/181, 600; 977/732
See application file for complete search history.

(56) References Cited

U.S. PATENT DOCUMENTS

| 6,706,402 B2 | 3/2004 | Rueckes et al. |
| 6,781,166 B2 | 8/2004 | Lieber et al. |
| 2006/0255395 A1 | 11/2006 | Fujita et al. |
| 2009/0020399 A1* | 1/2009 | Kim et al. .................... 200/181 |

FOREIGN PATENT DOCUMENTS

| JP | 2006-318670 | 11/2006 |
| JP | 2007-103529 | 4/2007 |

OTHER PUBLICATIONS

International Search Report from Japanese Patent Office for International Application No. PCT/JP2009/066805, mailed Dec. 1, 2009.

* cited by examiner

*Primary Examiner* — Ramon Barrera
(74) *Attorney, Agent, or Firm* — Finnegan, Henderson, Farabow, Garrett & Dunner, L.L.P.

(57) ABSTRACT

According to one embodiment, a switch device includes a first switching unit provided on a base substance. The first switching unit includes a first supporting electrode, a first beam, a first contact point electrode, a first floating conductive layer and a first control electrode. The first supporting electrode is fixed to the base. The first beam includes a first holding part and a first movable part. The first holding part is fixed to the base. The first movable part has one end connected to the first holding part. The first contact point electrode is fixed to the base and faces the first movable part. The first floating conductive layer is fixed to the first movable part via a first insulating part and stores a charge. The first control electrode is fixed to the base and faces the first floating conductive layer.

21 Claims, 19 Drawing Sheets

SWITCH DEVICE AND CIRCUIT INCLUDING SWITCH DEVICE

CROSS-REFERENCE TO RELATED APPLICATIONS

This is a continuation application of International Application PCT/JP2009/066805, filed on Sep. 28, 2009; the entire contents of which are incorporated herein by reference.

FIELD

The embodiment generally relates to a switch device and a circuit including the switch device.

BACKGROUND

A mechani-electrical switch device being more downsacalable than a semiconductor device such as MOSFET produces no leak current in principle and has a small ON-resistance, and thereby application to various memories and logic circuits allows a low power consumption integrated circuit to be realized.

JP-A 2006-318670 (Kokai) discloses a switch device which can be driven at a low voltage and operated at a high speed. This switch device includes a first electrode, a movable part repeating contact/non-contact to the first electrode and made of carbon material such as carbon nanotube or the like, a second electrode connected to the movable part, a floating gate electrode connected to the movable part via an insulating layer, and a gate electrode controlling the movable part by an electrostatic force.

There is room for improvement for stabilizing more the operation of this switch device. This, for example, gives characteristics of non-volatility and volatility, and further expands application field.

DETAILED DESCRIPTION

According to one embodiment, a switch device includes a first switching unit provided on a base. The first switching unit includes a first supporting electrode, a first beam, a first contact point electrode, a first floating conductive layer and a first control electrode. The first supporting electrode is fixed to the base. The first beam includes a first holding part and a first movable part. The first holding part is fixed to the base, electrically connected to the first supporting electrode, and includes metal-carbidized multilayer graphene. The first movable part has one end connected to the first holding part, is separated from the base and includes multilayer graphene. The first contact point electrode is fixed to the base and faces the first movable part. The first floating conductive layer is fixed to the first movable part via a first insulating part and stores a charge. The first control electrode is fixed to the base and faces the first floating conductive layer.

Various embodiments will be described hereinafter with reference to the accompanying drawings.

The figures are schematic or conceptual, and a relationship between thickness and width in each component, a ratio or coefficient of size between components may not necessarily be the same as the actual configuration. Furthermore, even when representing the same component, the dimension, and ratio or coefficient may be represented differently in different figures.

In the specification and the figures of the application, the same reference numbers are applied to the same elements already described in relation to previous figures, and detailed description will not be repeated as appropriate.

First Embodiment

Figure 1A:
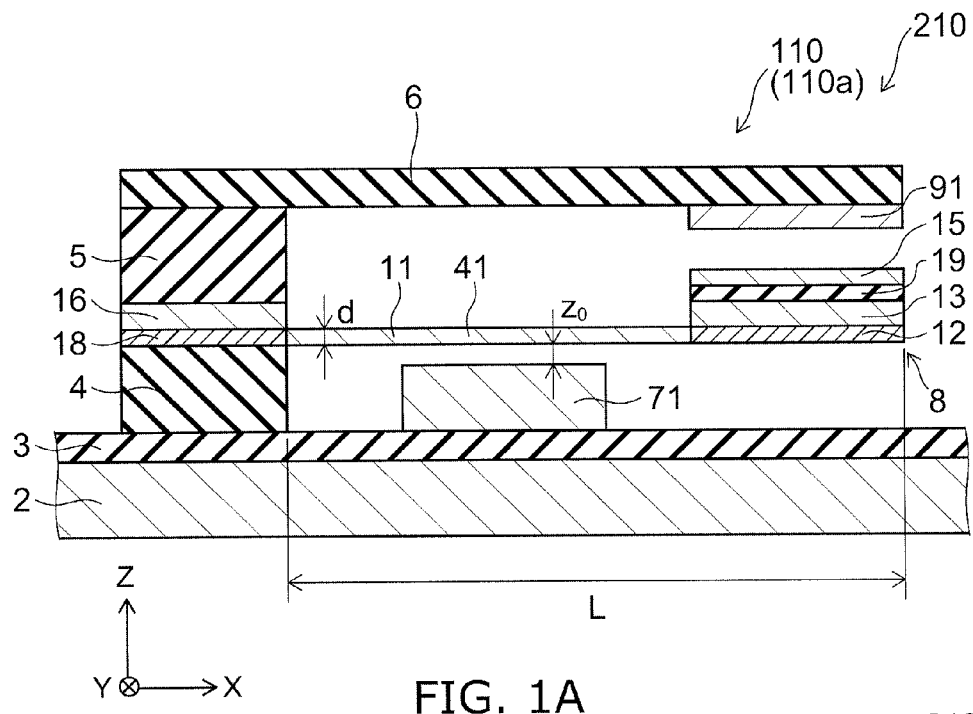
FIGS. 1A and 1B are schematic views showing a switch device.
Figure 1B:
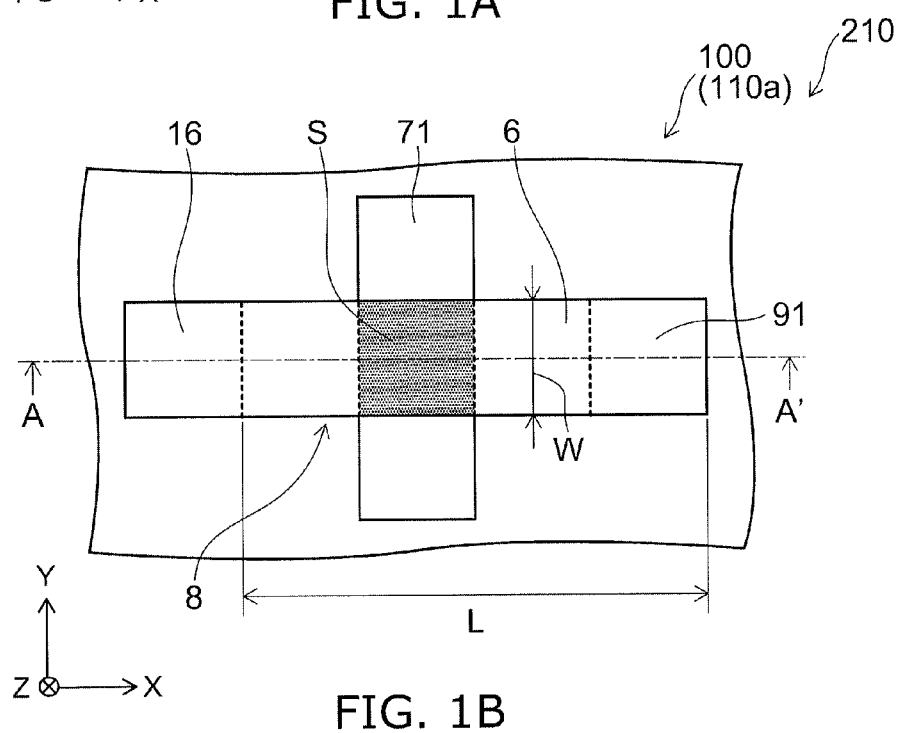

FIGS. 1A and 1B are schematic views illustrating the configuration of a switch device according to a first embodiment of the invention.

In other words, FIG. 1B is a schematic plan view illustrating the switch device, and FIG. 1A is a schematic sectional view showing a section along line A-A' of FIG. 1B.

As shown in FIGS. 1A and 1B, the switch device 210 according to the embodiment includes a switching unit 110 (first switching unit 110a) provided on a base substance 2.

Here, the base substance 2 can be based on an arbitrary structure body, and various insulating substrates, conductive substrates and semiconductor substrates can be used. As described later, when a circuit including the switch device is stacked, a circuit in a lower layer can be regarded as the base substance 2. Here, an insulating layer 3 is provided on a major surface of the base substance 2, and the insulating layer 3 is regarded as a part of the base substance 2.

The switching unit 110 includes a supporting electrode 16 (first supporting electrode), a contact point electrode 71 (first contact point electrode), a beam 8 (first beam), a control electrode 91 (first control electrode), and a floating conductive layer 15 (first floating conductive layer).

The supporting electrode 16, the contact point electrode 71 and the control electrode 91 are fixed to the base substance 2 to be provided. In the specific example, the supporting electrode 16 is provided on a holding part 18 described later of the beam 8, and the holding part 18 is provided on an insulating layer 4 provided on the insulating layer 3 on the base substance 2.

The contact point electrode 71 is directly provided on the insulating layer 3 on the base substance 2.

The control electrode 91 is provided on a plane on the base substance side of an insulating layer 6 protruding from an insulating layer 5 in a region above the base substance 2, the insulating layer 6 being provided on the insulating layer 5. In the specific example, the control electrode 91 is spaced from the base substance 2 (including the insulating layer 3).

Thus, the supporting electrode 16, the contact point electrode 71 and the control electrode 91 are provided on the insulating layer 3 (here, included in the base substance 2) directly or via various interlayer insulating layer etc., and the positional relationship to the base substance 2 is fixed.

Thus, "being fixed to the base substance 2" includes being directly provided on the base substance 2 and being provided on the base substance 2 via various structure bodies (including insulating layer, interlayer insulating layer, conductive layer and semiconductor layer etc.), and further indicates including being spaced from the base substance 2, not being variable in the positional relationship to the base substance 2, and being fixed in the positional relationship to the base substance 2.

Positions where the supporting electrode 16, the contact point electrode 71 and the control electrode 91 are provided can be variously changed as described later.

As shown in FIG. 1A, the supporting electrode 16 supports the beam 8.

In other words, the beam 8 includes the holding part 18 (first holding part) fixed to the base substance 2 and electrically connected to the supporting electrode 16, a movable part 11 (first movable part) having one end connected to the holding part 18 and being spaced from the base substance 2. The movable part 11 is a part of the beam 8 extending from the holding part 18 toward above the base substance 2 spaced from the base substance 2. The holding part 18 of the beam 8 can be directly bonded to the supporting electrode 16. In the following, the case where the holding part 18 of the beam 8 is directly bonded to the supporting electrode 16 will be described.

In the case of the holding part 18 as well, being fixed to the base substance 2 includes being provided via various structure bodies (including insulating layer, interlayer insulating layer, conductive layer and semiconductor layer) provided on the base substance 2. In the specific example, the holding part 18 is provided on the insulating layer 4 provided on the insulating layer 3 of the base substance 2.

The beam 8 includes a multilayer graphene. That is, the beam 8 is formed from a multilayer graphene. The holding part 18 includes a metal-carbidized multilayer graphene. On the other hand, the movable part 11 includes a multilayer graphene, but the multilayer graphene is not metal-carbidized.

The contact point electrode 71 faces the movable part 11. A portion of the movable part 11 facing the contact point electrode 71 is referred to as a contact point part 41 (first contact point part).

The floating conductive layer 15 is annexed to the movable part 11 via an insulating part 19 (first insulating part), and the floating conductive layer 15 stores charge. In the specific example, the floating conductive layer 15 is annexed to an end of the movable part 11 opposite to the holding part 18. However, a portion of the movable part 11 where the floating conductive layer 15 is annexed is arbitrary, and as described later, various variations are possible. The portion of the movable part 11 where the floating conductive layer 15 is provided is called as a control part 12 (first control part).

As illustrated in FIG. 1A, in the specific example, a contact electrode 13 (first contact electrode) is provided on a plane opposite to the base substance 2 of the control part 12 of the movable part 11, the insulating part 19 is provided thereon, and the floating conductive layer 15 is provided on the insulating part 19. In the specific example, the insulating part 19 functions as a tunneling insulating film.

As shown in FIG. 1B, a direction in which the holding part 18 of the beam 8 and the movable part 11 face each other is an extending direction of the beam 8. The extending direction is taken as an X-axis direction. A direction perpendicular to the major surface of the base substance 2 is taken as a Z-axis direction. A direction perpendicular to the X- axis direction and the Z-axis direction is taken as a Y-axis direction.

In the switching unit 110, the contact point part 41 and the control part 12 are provided different positions in the extending direction (X-axis direction) of the beam 8. The contact point part 41 is provided between the control part 12 and the holding part 18.

However, in the embodiment of the invention, positions where the contact point part 41 and the control part 12 are provided in the movable part 11 are arbitrary. As described later, the contact point part 41 and the control part 12 are provided at the same position along the extending direction of the beam 8, and for example, the contact point part 41 may be provided on a plane of the beam 8 on a side of the base substance 2, and the control part 12 may be provided on a plane of the beam 8 on a side opposite to the base substance 2, or the configuration may be inversed.

In the specific example, the floating conductive layer 15 is provided by being stacked along the Z-axis direction perpendicular to the extending direction of the beam 8. The embodiment is not limited to this, and it is possible to vary the configuration of the floating conductive layer 15 variously. For example, as described later, the floating conductive layer 15 may be provided along the extending direction (X-axis direction) of the beam 8 in the generally same plane as the plane where the control part 12 is provided.

In the specific example, the control part 12 provided with the floating conductive layer 15 includes the metal-carbidized multilayer graphene. That is, of the movable part 11, the part (control part 12) where the floating conductive layer 15 is annexed is metal-carbidized.

However, as described later, the control part 12 may not always be metal-carbidized depending on the configuration of the floating conductive layer 15 provided on the control part 12.

The control electrode 91 faces the floating conductive layer 15. The control electrode 91 puts the movable part 11 into a contact or non-contact state to the contact point electrode 71. Specifically, the movable part 11 puts the contact point part 41 into a contact or non-contact state to the contact point electrode 71.

In the specific example, the supporting electrode 16 and the contact electrode 13 are electrically connected each other via the beam 8 including the multilayer graphene having conductivity. In the state illustrate in FIG. 1A, the control electrode 91 and the contact point electrode 71 are electrically insulated from the supporting electrode 16 and the contact electrode 13.

Although not shown directly in the figure, the control electrode 91 is connected to an external signal terminal and is able to store positive charges or negative charges to the control electrode 91 by an electrical signal (first electrical signal) inputted to the external signal terminal. Thereby, the movable part 11 of the beam 8 moves in response to the first electrical signal applied to the control electrode 91. For example, negative charges are previously stored in the floating conductive layer 15, and negative charges are stored in the control electrode 91 by the first electrical signal applied to the control electrode 91, and thus repulsive force due to an electrostatic force can be operated between the control electrode 91 and the floating conductive layer 15. Thereby, when the contact point part 41 contacts the contact point electrode 71, the supporting electrode 16 is electrically connected to the contact point electrode 71 via the movable part 11. When another electrical signal is inputted to the control electrode 91 (or for example, the electrical signal is not applied), for example, the contact point part 41 is separated from the contact point electrode 71 due to elastic force of the beam 8, and the supporting electrode 16 is electrically insulated from the contact point electrode 71. Thus, the switching operation is performed in the switching unit 110. In other words, for example, the supporting electrode 16 can be caused to function as an input electrode and the contact point electrode 71 can be caused to function as an output electrode, or the supporting electrode 16 can be caused to function as the output electrode and the contact point electrode 71 can be caused to function as the input electrode. The switching operation will be described in detail later.

Materials used for the above supporting electrode 16, the contact point electrode 71, the control electrode 91 and the floating conductive layer 15 are arbitrary, and arbitrary conductive layers such as various metals and semiconductors can be used. However, it is desired that a metal be used for the supporting electrode 16. Thereby, in the case where the holding part 18 of the beam 8 is directly bonded to the supporting electrode 16, the metal used for the supporting electrode 16 can be diffused into the multilayer graphene serving as the beam 8 and the holding part 18 of the beam 8 can be metal-carbidized, therefore the use of metal for the supporting electrode 16 is advantageous.

The multilayer graphene is a stacked body stacking a plurality of graphene layer, and is graphite. Interlayer bonding between the graphene layers is weak and peeling occurs easily between the layers. Metal-carbidization of the multilayer graphene forms metal bonding between stacked graphene layers to strengthen the bonding between the graphene layers. The graphene layers and the multilayer graphene have conductivity.

The stacking direction of the graphene layers included in the multilayer graphene in the beam 8 is a direction along which the movable part 11 of the beam 8 moves, that is, a direction along which the floating conductive layer 15 and the control electrode 91 face each other. In the specific example, the stacking direction of the graphene layers is the z-axis direction, and the plurality of graphene layers are stacked along the direction perpendicular to the major surface of the base substance 2.

Thus, the beam 8 includes the multilayer graphene. A part of the beam 9 is selectively metal-carbidized. In other words, the holding part 18 of the beam 8 includes the metal-carbidized multilayer graphene, and the control part 12 facing the floating conductive layer 15 of the beam 8 also includes the metal-carbidized multilayer graphene. The movable part 11 (including the contact point part 41) of the beam 8 includes not metal-carbidized multilayer graphene.

Thus, the bonding between the graphene layers in the multilayer graphene of the holding part 18 is strengthened by using the metal-carbidized multilayer graphene as the holding part 18. Thereby, for example, the graphene layers of the holding part 18 are suppressed from being peeled on the insulating layer 4 to separate the insulating layer 4 from the supporting electrode 16.

Furthermore, in the specific example, the bonding between the graphene layers in the multilayer graphene of the control part 12 is strengthened by using the metal-carbidized multilayer graphene as the control part 12 having the floating conductive part 15 annexed, and the floating conductive layer 15, the insulating part 19 and the contact electrode 13 provided on the control part 12 are suppressed from separated from the control part 12.

The movable part 11 can have moderate flexibility and moderate elasticity by using the not metal-carbidized multilayer graphene as the movable part 11 (including the contact point part 41) of the beam 8, and desired operation of the movable part 11 can be realized.

In the case of a comparative example using, for example, carbon nanotube as the beam, for example, a bundle type beam is used, in which carbon nanotubes are arrayed in one direction. However, this bundle type beam is difficult to be manufactured and it is difficult to array the nanotubes with a high density using a CVD (Chemical Vapor Deposition) method and a coating process. Fluctuation of characteristics is also large.

On the contrary, in the switching unit 110 of the switch device 210 according to the embodiment, the multilayer graphene is used for the beam 8. Therefore, fabrication is easy and uniform and stable characteristics can be obtained.

The bonding between the graphene layers can be strengthened by metal-carbidizing the multilayer graphene used for the holding part 18 of the beam 8 and the control part 12 of the beam 8, and thus mechanical strength of these parts can be improved and the stable operation can be realized.

Thus, the switch device 210 according to the embodiment can provide a switch device including a stably operable switching unit of mechanical-electrical system.

For example, in the case of the comparative example using materials such as Si, SiN and SiC as the beam 8, since elastic constants of these materials are larger than that of multiplayer graphene, drive voltage is high and coating of a metal of gold on a contact point of the contact point part is required. This causes a contact point friction problem. Moreover, the elastic constant is large, and thus the operation is slow and the operation is limited to non-volatility.

On the contrary, in the switching unit 110 according to the embodiment, the multilayer graphene is used for the beam 8, and thereby the elastic constant can be set to an appropriate value, and the drive voltage is low without a contact point friction problem, allowing operation at a high speed. As described later, the multilayer graphene is used for the beam 8 and the number of the multilayer graphene is set adequately, and thereby the operations of both volatility and non-volatility become possible and the application field can be expanded. Moreover, in the switching unit 10, a resistance in a contact state of the contact point part 41 and the contact point electrode 71 is low, that is, an ON resistance is low. When the contact point part 41 and the contact point electrode 71 are in a non-contact state, both are completely separated to produce substantially no OFF leak current.

The configuration of the switching unit 110 illustrated in FIG. 1A can be variously varied.

For example, the supporting electrode 16 is fixed to the base substance 2 and it is sufficient to support the beam 8, for example, the supporting electrode 16 may be provided between the insulating layer 4 and the holding part 18.

In the switching unit 110, the contact point electrode 71 is provided on the base substance 2 side of the beam 8, but the contact point electrode 71 may be provided on a side of the beam 8 opposite to the base substance 2.

The control electrode 91 only needs to face the floating conductive layer 15 annexed to the moving part 11 of the beam 8, for example, the control electrode 91 may be provided on the base substance 2 side of the beam 8. The floating conductive layer 15 faces the control electrode 91, and thus in this case, the floating conductive layer 15 is disposed on the base substance 2 side of the beam 8.

Next, the operation of the switching unit 110 will be described.

Figure 2:
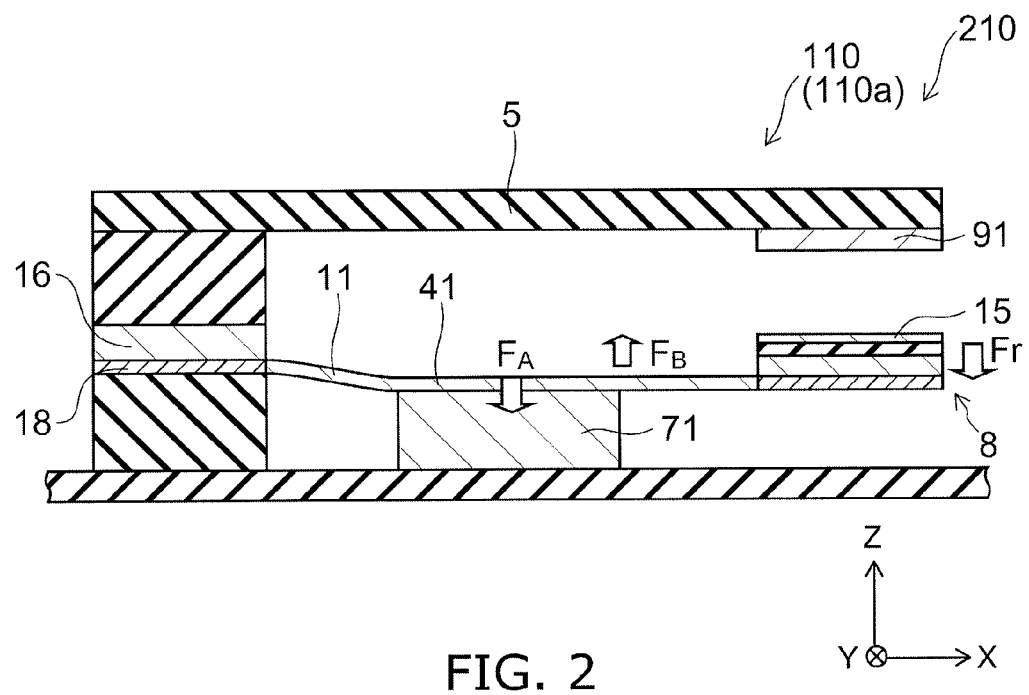
FIG. 2 is a schematic sectional view showing the operation of a switching unit.

FIG. 2 is a schematic sectional view illustrating the operation of the switching unit according to the first embodiment.

In other words, FIG. 2 is a sectional view corresponding to A-A' line section of FIG. 1B.

In a state illustrated in FIG. 1A, for example, potential of the control electrode 91 is set higher than potential of the supporting electrode 16. For example, the supporting electrode 16 is grounded and positive voltage is applied to the control electrode 91. Thereby, a tunnel current flows from the floating conductive layer 15 toward the contact electrode 13 via the insulating part 19 (tunnel insulating film). Thus, electrons are injected into the floating conductive layer 15, and the floating conductive layer 15 charges negatively. Alternatively, the charge injection into the floating conductive layer 15 may be performed using a method of electron injection by electron irradiation.

In this state, the potential of the control electrode 91 is set lower than the potential of the supporting electrode 16. For example, the supporting electrode 16 is grounded and the negative voltage is applied to the control electrode 91.

Thereby, as shown in FIG. 2, a repulsive force Fr is generated between the control electrode 91 and the floating conductive layer 15 charged negatively, and the movable part 11 deforms in the direction toward the base substance 2, and thus the contact point part 41 and the contact point electrode 71 are in contact with each other. Graphene has excellent elasticity and deforms with flexibility, and thus the movable part 11 deforms so that the contact point part 41 contacts the contact point electrode 71 in parallel. Thereby, the supporting electrode 16 is electrically connected to the contact point electrode 71.

When the negative voltage applied to the control electrode 91 is removed from the state in which the contact point part 41 and the contact point electrode 71 contact each other, the repulsive force Fr operating between the control electrode 91 and the floating conductive layer 15 disappears.

Thereby, elastic force of the movable part 11 put the movable part 11 back in a direction toward the control electrode 91, and the electrical connection between the supporting electrode 16 and the contact point electrode 71 is shut off. Thus, the switching unit 110 performs the volatile switching operation.

Alternatively, depending on the elastic force of the movable part 11, even after the negative voltage applied to the control electrode 91 is removed and the repulsive force Fr operating between the control electrode 91 and the floating conductive layer 15 disappears, the moving part 11 does not get back and the electrical connection between the supporting electrode 16 and the contact point electrode 71 is maintained. Thus, the switching unit 110 performs the non-volatile switching operation.

In this manner, the elastic force $F_B$ of the movable part 11 can be set larger than or smaller than a van der Waals' force $F_A$ operating between the movable part 11 and the contact point electrode 71 when the movable part 11 (for example, contact point part 41) and the contact point electrode 71 are in contact with each other. Thereby, in the former case, the volatile switching operation is possible, which separates the movable part 11 (contact point part 41) and the contact point electrode 71 each other in the case of removing the electrical signal applied to the control electrode 91, and in the latter case, the non-volatile operation is possible, which maintains the contact state of the movable part 11 (contact point part 41) and the contact point electrode 71 even after the electrical signal applied to the control electrode 91 is removed.

The volatile operation and the non-volatile operation can be controlled, for example, by the layer number (thickness of the movable part 11) of the multilayer graphene of the movable part 11, a length of the movable part 11 and setting of a distance between the movable part 11 (contact point part 41) and the contact point electrode 71 and type of the contact point electrode 71 or the like.

As illustrated in FIG. 1A and 1B, the length L of the movable part 11 is a length from a boundary between the holding part 18 supported by the supporting electrode 16 and the movable part 11 to an end of the movable part 11 on a side opposite to the holding part 18. That is, the length L corresponds to a length of a movable part of the beam 8 along the extending direction (X-axis direction) of the beam 8.

The thickness of the multilayer graphene serving as the movable part 11 is taken as a thickness d. Here, the thickness d is a length of the movable part 11 in a direction perpendicular to the extending direction (X-axis direction) of the beam 8 and along a movable direction (in this example, Z-axis direction) of the movable part 11. The movable direction is a direction in which the floating conductive layer 15 annexed to the movable part 11 and the control electrode 91 face each other. That is, in the specific example, the thickness d is a length of the movable part 11 along the Z-axis direction.

A width of the movable part 11 is taken as a width w. The width w is a length of the movable part 11 along the direction (Y-axis direction) perpendicular to the extending direction (X-axis direction) of the movable part 11 and the movable direction (in this example, Z-axis direction) of the movable part 11.

An area of a plane where the movable part 11 (for example, contact point part 41) and the contact point electrode 71 face each other is taken as an area S.

A distance between the contact point electrode 71 and the movable part 11 (contact point part 41) in a state of not applying the electrical signal (for example, voltage) to the control electrode 91 is taken as an initial gap $z_0$.

In the following, the volatile and non-volatile operations in the switching unit 110 will be described. As shown in FIG. 2, the van del Waal's force $F_A$ generated by contact between the movable part 11 (contact point part 41) and the contact point electrode 71 is operated to the movable part 11 of the beam 8. The movable part 11 of the beam 8 has the elastic force $F_B$. The van del Waal's force $F_A$ operates so as to attract the movable part 11 to the contact point electrode 71. The elastic force $F_B$ operates so as to put the deformation of the movable part 11 back to the original state (a state before applying the electrical signal).

In the case where the repulsive force Fr between the control electrode 91 and the floating conductive layer 15 disappears, if the elastic force $F_B$ of the movable part 11 is larger than the van del Waal's force $F_A$, the volatile switching operation is obtained, in which the movable part 11 is separated from the contact point electrode 71 to get back toward the above.

On the other hand, in the case where the repulsive force Fr between the control electrode 91 and the floating conductive layer 15 disappears, if the van del Waal's force $F_A$ is larger than the elastic force $F_B$ of the movable part 11, the state of the movable part 11 being in contact with the contact point electrode 71 is maintained and the non-volatile switching operation is obtained.

The van del Waal's force $F_A$ is expressed by the following formula (1).

$$F_A = 0.6S \times \{6\pi(\delta r)^3\}^{-1} \qquad (1)$$

Here, a surface roughness δr is an average roughness of a surface of the contact point electrode 71, in the embodiment, the surface roughness δr can be taken to be 1 nm (nanometer).

On the other hand, the elastic force $F_B$ of the movable part 11 including the multilayer graphene is expressed by the following formulae.

$$F_B = k \times z \qquad (2)$$

$$k = (w/4) \times (d/L)^3 \times E \qquad (3)$$

Here, the displacement amount z is a displacement amount of an end of the movable part 11 (in this case, an end on an opposite side to the holding part 18) provided with the contact electrode 13. The characteristic value E is a characteristic value of material, and in the case of the multilayer graphene, 1 Tpa (terra Pascal) can be used as the characteristic value E.

Figure 3:
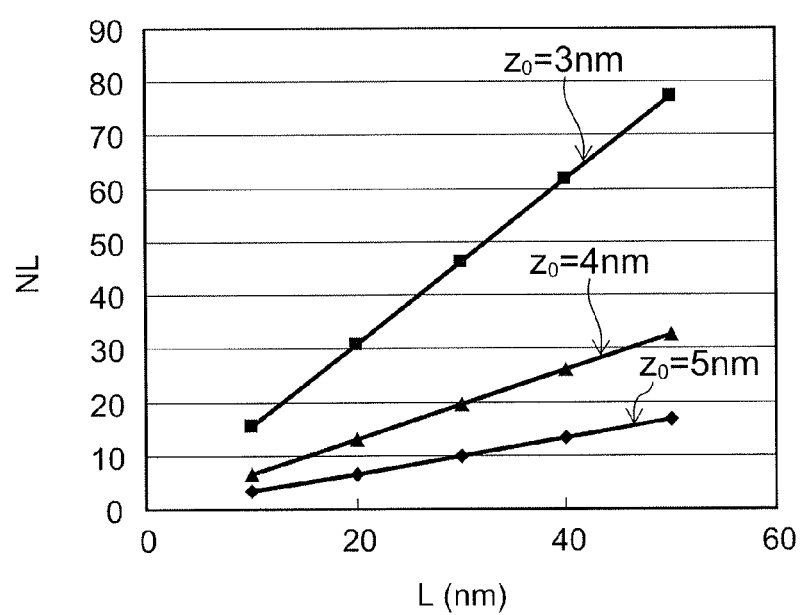
FIG. 3 is a graph view showing the characteristics of the switching unit.

FIG. 3 is a graph view illustrating the characteristics of the switching unit according to the first embodiment.

In other words, FIG. 3 shows a graph showing the characteristics of the switching unit 110 obtained by using the formulae (1) to (3). In FIG. 3, the horizontal axis represents the length L of the movable part 11, and the vertical axis represents the layer number NL of the multilayer graphene in the movable part 11. In FIG. 3, the plotted values are values at which the van del Waal's force $F_A$ is equal to the elastic force $F_B$ of the multilayer graphene of the movable part 11. FIG. 3 shows the characteristics in the cases where the initial gap $z_0$ (namely, displacement distance of the contact point part 41 of the movable part 11 in the operation) between the contact point electrode 71 and the movable part 11 is 3 nm, 4 nm and 5 nm. The layer number NL of the multilayer graphene of the movable part 11 is a value of the thickness d of the movable part 11 divided by 0.335 nm being a thickness of monolayer graphene. In the specific example, the width w of the movable part 11 has been 40 nm.

As shown in FIG. 3, for example, when the initial gap $z_0$ between the contact point electrode 71 and the movable part 11 is 4 nm and the length of the movable part 11 is 40 nm, the layer number NL of the multilayer graphene where the van del Waal's force $F_A$ and the elastic force $F_B$ of the multilayer graphene balance is 25. When the layer number NL of the multilayer graphene is larger than 25, the elastic force $F_B$ of the movable part 11 is larger than the van del Waal's force $F_A$, and the volatile switching operation is performed. The layer number NL is smaller than 25, the van del Waal's force $F_A$ is larger than the elastic force $F_B$ of the movable part 11, and the non-volatile operation is performed.

The layer number NL of the multilayer graphene of the movable part 11 affects the drive voltage (for example, the voltage applied to the control electrode 91). That is, in performing the volatile operation, with increasing the layer number NL of the graphene, the elastic force $F_B$ increases, therefore, the drive voltage applied to the control electrode 91 for displacement of the movable part 11 increases. The layer number NL of the multilayer graphene of the movable part 11 is determined on the basis of a range of allowable drive voltage.

On the other hand, in the case of the non-volatile switch, the layer number of the graphene is decreased to reduce the elastic force $F_B$ in order to stably maintain contact between the contact point part 41 of the movable part 11 and the contact point electrode 71. However, the layer number NL of the graphene is too decreased, for example, the contact point part 41 may not be separated from the contact point electrode 71 even though the electrical signal (for example, voltage) applied to the control electrode 91 is changed. Therefore, the layer number NL of the graphene is set to an adequate value so that the adequate operation is performed.

Figure 4A:
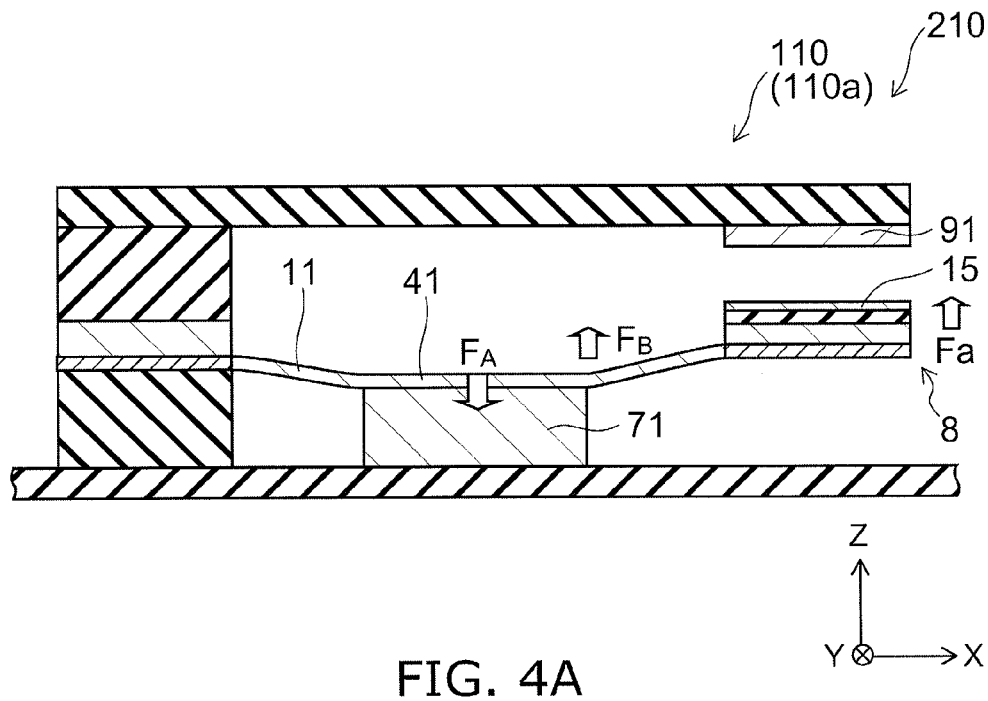
FIGS. 4A and 4B are schematic sectional views showing the operation of the switching unit.
Figure 4B:
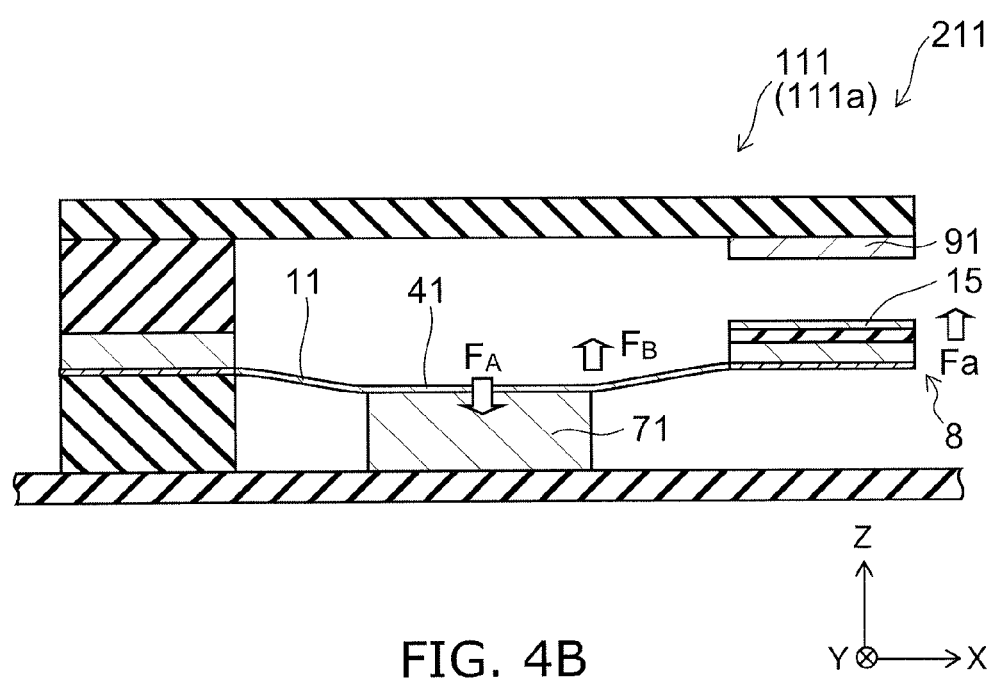

FIGS. 4A and 4B are schematic sectional views illustrating the operation of the switching unit according to the first embodiment.

In other words, FIGS. 4A and 4B are sectional views corresponding to section along A-A' line of FIG. 1B. A switching unit 111 (first switching unit 111a) of a switch device 211 illustrated in FIG. 4B has a thinner graphene layer with the thickness d of the movable part 11 than the switching unit 110 illustrated in FIG. 4A. These figures show an example of the switching unit 110 performing the non-volatile operation.

As shown in FIG. 4A, a suction force Fa is caused to generate between the control electrode 91 and the floating conductive layer 15 by applying the positive voltage to the control electrode 91 in order to separate the contact point part 41 from the contact point electrode 71 in the switching unit 110. Thereby, the contact point electrode 71 and the contact point part 41 are separated each other from the state in which the contact point electrode 71 and the contact point part 41 contact each other.

In other words, the electrical signal is applied to the control electrode 91, and the contact point part 41 is brought into contact with the contact point electrode 71 by the repulsive force Fr based on the generated electrostatic force, thereafter even if the first electrical signal is removed, this state is maintained. Another electrical signal different from the first electrical signal (for example, different polarity) is applied to the control electrode 91, and the contact point part 41 is separated from the contact point electrode 71 by the suction force Fa based on the generated another electrostatic force. This can realize the non-volatile switching operation.

At this time, as shown in FIG. 4B, the layer number NL of the multilayer graphene of the movable part 11 is small and the thickness d is thin in the switching unit 111. When the thickness d is too thin, even if a tip of the movable part 11 displaces toward the control electrode 91 by the suction force Fa, the elastic force $F_B$ generated at the contact point part 41 is not greater than the van del Waal's force $F_A$, and thus the contact point part 41 may not be separated from the contact point electrode 71. Therefore, it is desired that the layer number NL (namely, thickness d) of the graphene of the movable part 11 is set to an adequate value so that the adequate operation is performed.

For example, when the area S of the plane where the contact point part 41 and the contact point electrode 71 face each other is 40 nm×40 nm, the van del Waal's force $F_A$ calculated by the formula (1) is about 50 nN.

On the other hand, the layer number NL where the elastic force $F_B$ of the movable part 11 exceeds 50 nN can be calculated from the formulae (2) and (3) as follows.

For example, if the width w of the movable part 11 is 40 nm, the length L is 160 nm, and the floating conductive layer 15 moves by 5 nm toward the control electrode 91 with reference to the contact point electrode 71, the thickness d of the multilayer graphene where the elastic force $F_B$ of the movable part 11 is greater than 50 nN is more than 4 nm, and the layer number NL is more than 12. The layer number NL desired for this operation changes depending on dimensions of the device (width w, length L, and distance $z_0$ etc.).

Depending on the dimensions of the device, the relationship between the above elastic force $F_B$ and the van del Waal's force $F_A$ can be set to a prescribed relationship even if the monolayer graphene is used as the beam, however since the elastic force of the monolayer graphene is small, large restriction occurs in the design of the device.

On the contrary, in the switching unit 110 according to the embodiment, use of the multilayer graphene as the beam 8 allows the elastic force $F_B$ of the movable part 11 of the beam 8 to be set to an adequate value, the restriction in designing the device can be removed, and a switch device having an intended configuration can be realized. As described above, control of the layer number NL (thickness d) of the multilayer graphene in the movable part 11 allows both characteristics of the volatility and non-volatility to be easily achieved.

Figure 5:
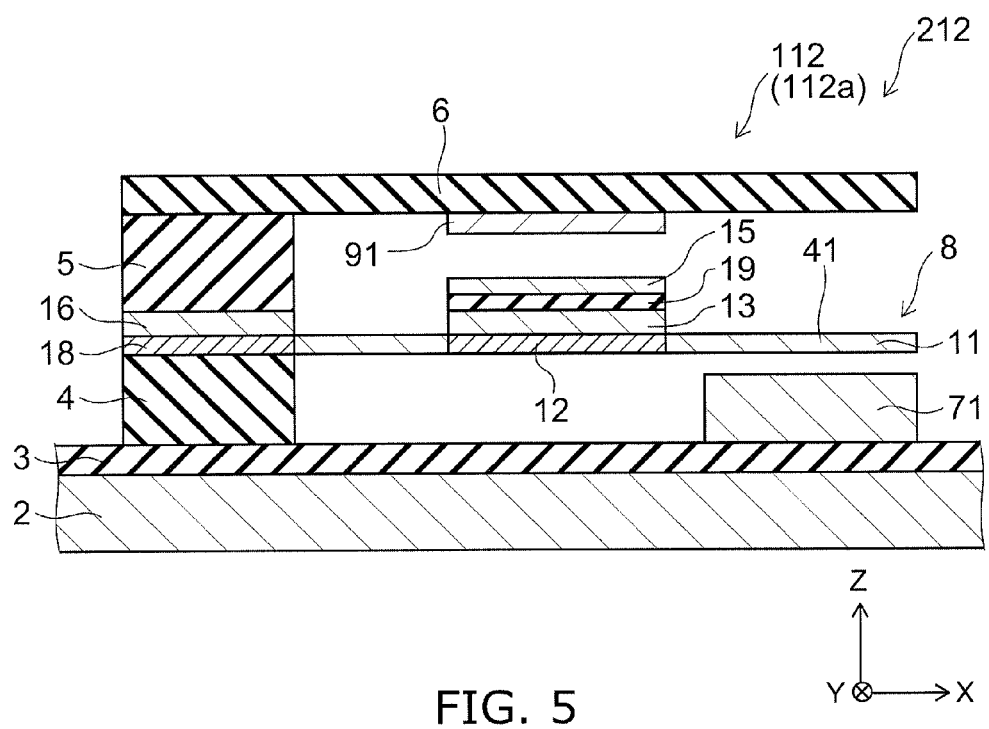
FIG. 5 is a schematic sectional view showing a switch device.

FIG. 5 is a schematic sectional view illustrating the configuration of another switch device according to the first embodiment.

As shown in FIG. 5, in a switching unit 112 (first switching unit 112a) of another switch device 212 according to the embodiment, the contact point part 41 of the movable part 11 of the beam 8 is provided at the tip of the movable part 11 (end on an opposite side to the holding part 18) and the control part 12 is provided between the contact point part 41 of the movable part 11 and the holding part 18. That is, the control part 12 is provided at the center part of the movable part 11.

The contact point electrode 71 is disposed at a position of the tip of the movable part 11 (end on the opposite side to the holding part 18) so as to face the contact point part 41 of the movable part 11. The control electrode 91 is disposed at a position corresponding to the center part of the movable part 11 so as to face the floating conductive layer 15 of the control part 12. The configuration other than the above is similar to the switching unit 110, and the description will be omitted.

Also in this case, the control part 12 facing the floating conductive layer 15 of the movable part 11 includes metal-carbidized graphene.

In the switching unit 112 having the configuration like this, displacement amount of the center part provided with the floating conductive layer 15 can be decreased with respect to displacement amount of the tip of the movable part 11. Thereby, for example, the drive voltage applied to the control electrode 91 can be reduced.

Figure 6:
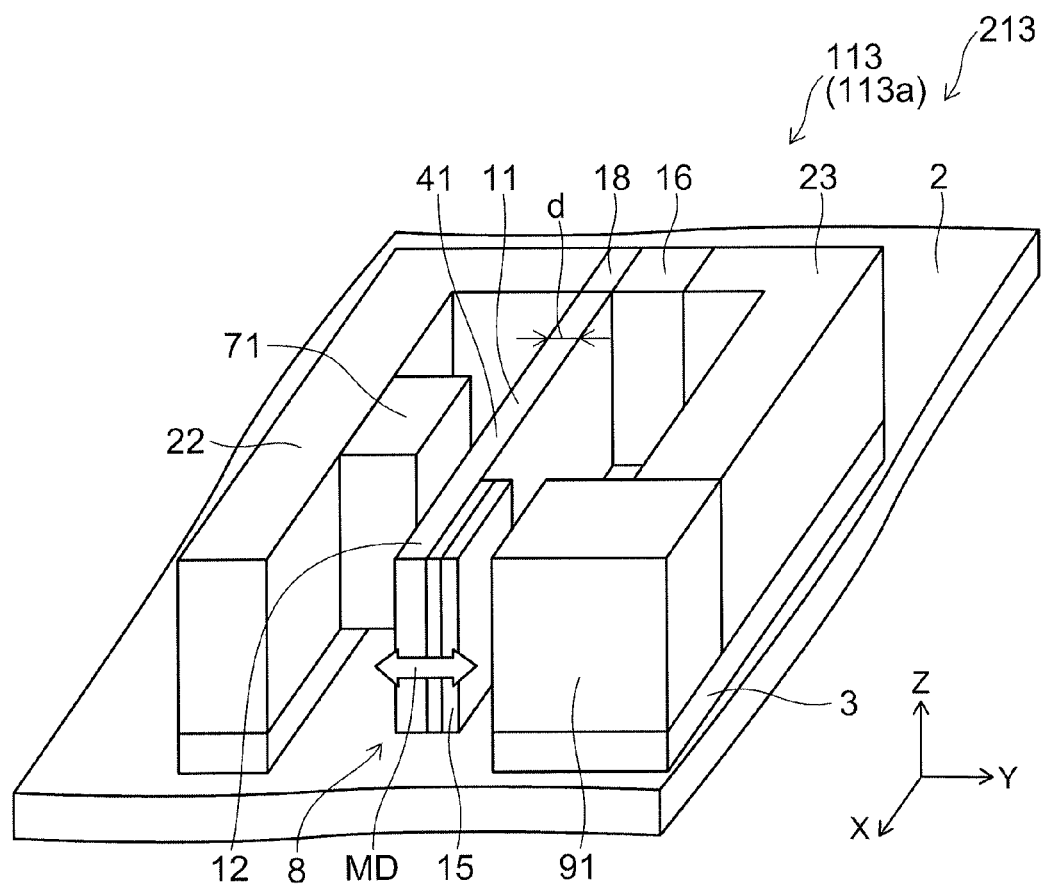
FIG. 6 is a schematic perspective view showing a switch device.

FIG. 6 is a schematic perspective view illustrating the configuration of another switch device according to the first embodiment of the invention.

As shown in FIG. 6, in a switching unit 113 (first switching unit 113a) of another switch device 213 according to the embodiment, the movable part 11 of the beam 8 moves in a plane parallel to the major surface of the base substance 2. Specifically, a direction MD along which the movable part 11 moves is the Y-axis direction.

In other words, in the switching unit 113, the supporting electrode 16, the contact point electrode 71, the beam 8, the control electrode 91 and the floating conductive layer 15 are disposed in one plane parallel to the major surface of the base substance 2 (in X-Y plane). The supporting electrode 16, the contact point electrode 71 and the control electrode 91 are provided on the patterned insulating layer 3 and fixed with respect to the base substance 2. The contact point electrode 71 is provided on a side surface of an insulating layer 22 provided on the insulating layer 3, the supporting electrode 16 and the control electrode 91 are provided on a side surface of an insulating layer 23 provided on the insulating layer 3.

On the other hand, the movable part 11 of the beam 8 is supported by the supporting electrode 16 and separated from the base substance 2 (including the insulating layer 3).

The configuration like this can be fabricated by forming layers serving as each constituent element after providing a predetermined sacrifice layer on the base substance 2, and then removing the sacrifice layer.

The switching unit 113 has each constituent element provided on one plane parallel to the major surface of the base substance 2, and also it can be the same as the switching unit 110, and the operation and the characteristics are the same.

Also in the switching unit 113 of the specific example, the stacking direction of the graphene included in the multilayer graphene is a direction along which the movable part 11 of the beam 8 moves. The stacking direction is the Y-axis direction along which the floating conductive layer 15 and the control electrode 91 face each other. Therefore, the layer number NL of the multilayer graphene of the movable part 11 is also the stacking number of the graphene layer along the Y-axis direction.

The thickness d of the movable part 11 is the length of the movable part 11 in a direction along a movable direction (for example, the Y-axis direction) of the movable part 11.

Thus, the direction along which the movable part 11 moves of the switching unit 113 according to the embodiment can be a direction (Z-axis direction) perpendicular to the major surface of the base substance 2 like the switching units 110 to 113, or a direction (Y-axis direction) parallel to the major surface of the base substance 2 like the switching unit 113. Furthermore, the direction along which the movable part 11 moves can be an arbitrary direction with respect to the major surface of the base substance 2. For example, the direction may also be slanted to the major surface. For example, the movable direction of the movable part 11 can be slanted to the major surface by slanting a side surface of the sacrifice layer to the major surface of the base substance 2.

Second Embodiment

Figure 7A:
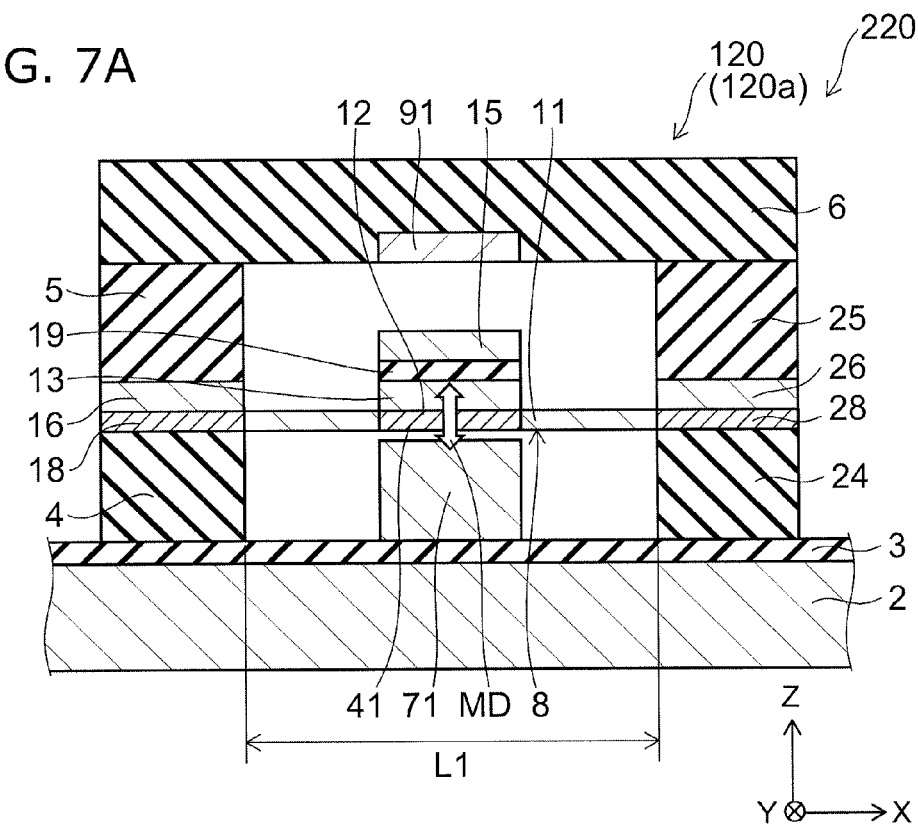
FIGS. 7A and 7B are schematic views showing a switch device.
Figure 7B:
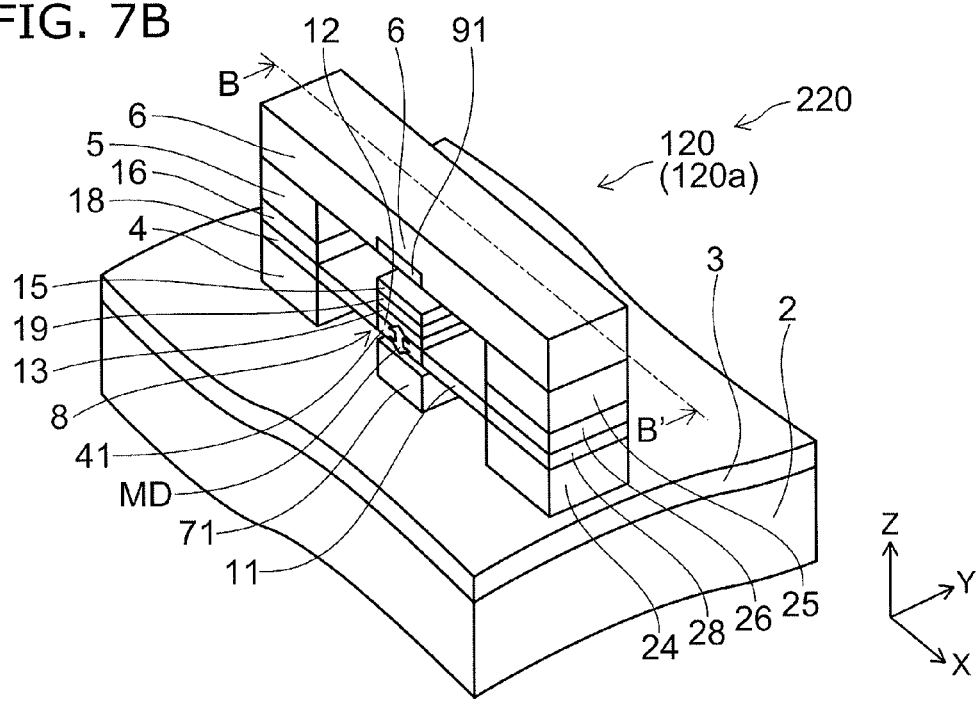

FIGS. 7A and 7B are schematic views illustrating the configuration of a switch device according to a second embodiment.

In other words, FIG. 7B is a schematic perspective view of a switching unit 120 of a switch device 220, and FIG. 7A is a sectional view along B-B' line of FIG. 7B.

As shown in FIG. 7A and 7B, in the switching unit 120 (first switching unit 120a) of the switch device 220 according to the embodiment, a facing holding part 28 (first facing holding part) on an opposite side of the movable part 11 to the holding part 18 is fixed to the base substance 2. The facing holding part 28 includes the metal-carbidized multilayer graphene.

Specifically, the switching unit 120 is fixed to the base substance 2 and further includes a facing supporting part 26 (first facing supporting part) fixing the facing holding part 28.

The facing supporting part 26 is fixed to the base substance 2 via an insulating layer 24 similar to the supporting electrode 16. Specifically, the insulating layer 24 is provided on the insulating layer 3 provided on the base substance 2. The facing holding part 28 of the beam 8 is provided on the insulating layer 24 and the facing supporting part 26 is provided on the facing holding part 28. An insulating layer 25 is provided on the facing supporting part 26 and the insulating layer 6 is provided on the insulating layer 25. On end of the insulating layer 6 is supported by the insulating layer 5 on the supporting electrode 16 and another end of the insulating layer 6 is supported by the insulating layer 25 on the facing supporting part 26.

The beam 8 is provided with the contact point part 41 and the control part 12 between both ends of the holding part 18 and the facing holding part 28. In the movable part 11, the contact point part 41 and the control part 12 are provided at the same position in the extending direction of the beam 8. In the specific example, in the center part of the movable part 11, a plane on the base substance 2 side of the movable part 11 is the contact point part 41, and a plane on the opposite side of the movable part to the base substance 2 is the control part 12.

This case is also an example where the control part 12 includes the meta-carbidized multilayer graphene and the contact point part 41 also includes the metal-carbidized multilayer graphene.

In the control part 12, the contact electrode 13 is provided on an opposite side to the base substance 2, the insulating part 19 (tunnel insulating film) is provided on the electrode 13, and the floating conductive layer 15 is provided on the insulating part 19. In other words, also in this case, the floating conductive layer 15 is provided in the control part 12 via the insulating part 19.

The contact point electrode 71 is provided on the base substance 2 side of the movable part 11 and faces the contact point part 41. The control electrode 91 is provided on the opposite side of the movable part to the base substance 2 and faces the floating conductive layer 15 annexed to face the control part 12.

In other words, the holding part 18 being one end of the beam 8 of the switching unit 120 is fixed to the supporting electrode 16 and the facing holding part 28 being another end of the beam 8 is fixed to the facing supporting part 26. In this case, the beam 8 has a center impeller type structure. A length L1 of the movable part 11 is a length of a portion of the beam 8 between the holding part 18 and the facing holding part 28.

Thus, the beam 8 has the configuration where the beam 8 is supported at both ends, and thereby the characteristics of the movable part 11 is stabilized and more stable operation can be achieved.

Conductive materials can be used for the facing supporting part 26. For example, materials serving as the supporting electrode 16 can be used for the facing supporting part 26. Thereby, the facing supporting part 26 can be used as an electrode.

In this case, in the switching unit 120, for example, it is possible that the supporting electrode 16 and the facing supporting part 26 are caused to function as input electrodes and the contact point electrode 71 is caused to function as an output electrode, alternatively the supporting electrode 16 and the facing supporting part 26 are caused to function as output electrodes and the contact point electrode 71 is caused to function as an input electrode.

Also in the switching unit 120, one of operations of volatility and non-volatility can be performed, for example, by controlling the layer number NL of the multilayer graphene on the movable part 11 similar to the switching unit 110.

At this time, in the switching unit 120, the elastic force $F_B$ described with regard to formulae (2) and (3) can be calculated by using (L1)/2 on behalf of L in the formula (3), and one of operations of volatility and non-volatility can be performed based on setting the elastic force $F_B$.

In the specific example, the facing supporting part 26 has a function to support the movable part 11 by the facing holding part 28 and simultaneously has a function as an electrode for obtaining electrical continuity to the movable part 11. However, in the embodiment, other than the above, for example, the facing supporting part 26 can be insulating. In this case, the facing supporting part 26 has only function supporting the movable part 11.

In the following, the case where the facing supporting part 26 is conductive and also functions as an electrode is described. That is, the facing supporting part 26 can be regarded as another supporting electrode facing the supporting electrode 16.

In the switching unit 120, the supporting electrode 16 and the facing supporting part 26 having a function as an electrode are provided at both ends of the beam 8, the contact point electrode 71 is provided to face the contact point part 41 of the movable part 11 between the supporting electrode 16 and the facing supporting part 26, and an electrostatic force is operated from the control electrode 91 to the floating conductive layer 15 annexed to the control part 12 of the movable part 11, and thereby the operation of moving the movable part 11 is possible. Thus, for example, a plurality of the switching units 120 are connected in series and the connected units can be caused to function as, for example, a NAND memory.

A method for manufacturing the switch device 220 will be described hereinafter.

FIG. 8A to FIG. 10C are sequential schematic sectional views illustrating a method for manufacturing the switch device 220 according to the second embodiment of the invention.

Figure 8A:
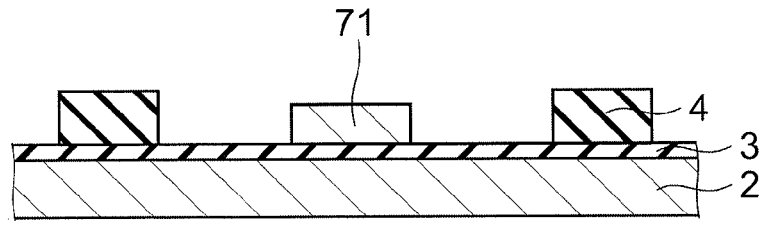
FIG. 8A to FIG. 10C are sequential schematic sectional views showing a method for manufacturing the switch device.
Figure 8B:
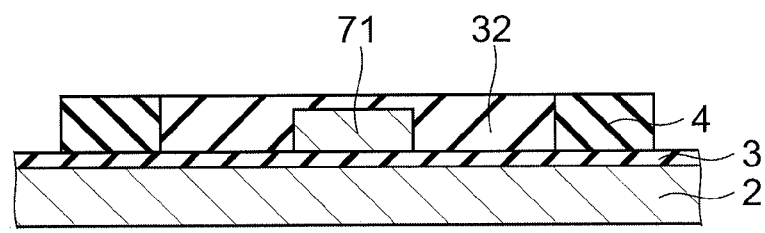
Figure 8C:
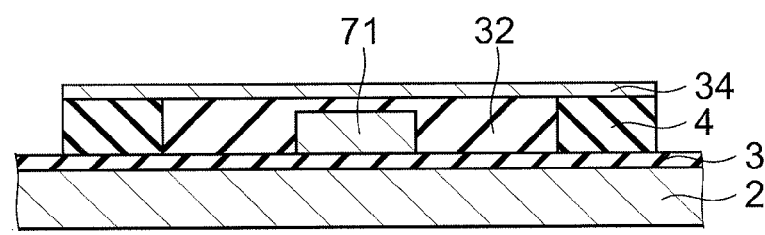
Figure 8D:
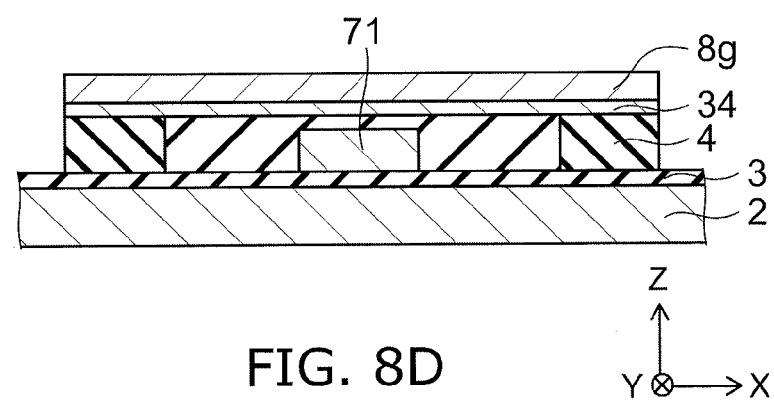
Figure 9A:
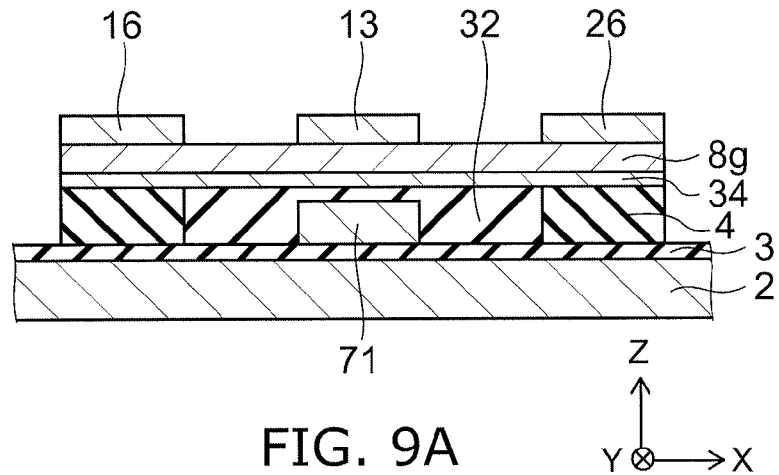
Figure 9B:
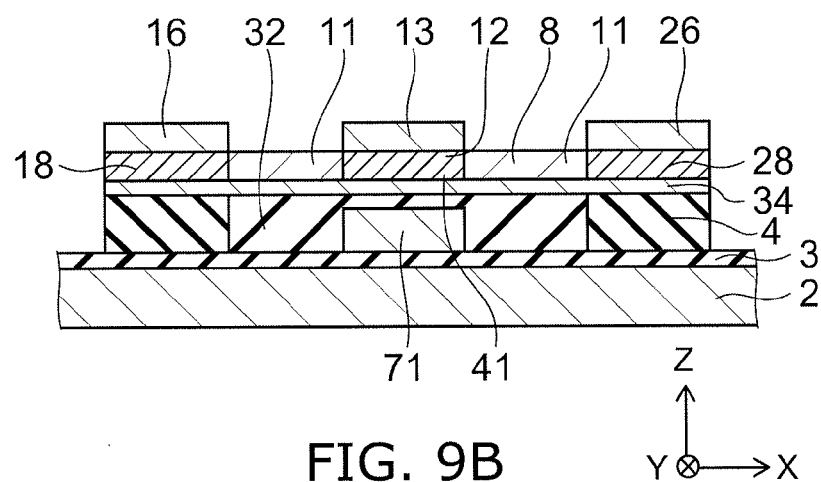
Figure 9C:
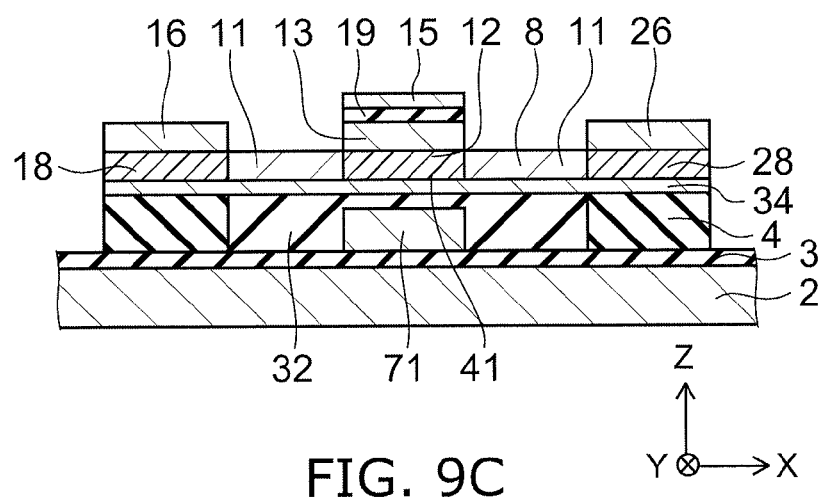
Figure 10A:
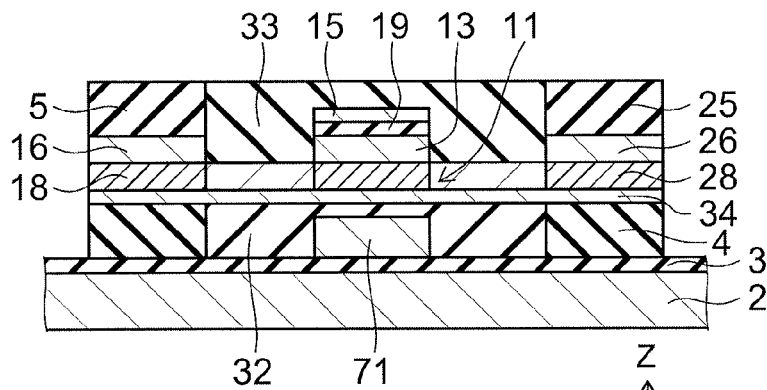

In other words, FIGS. 9A follows FIG. 8D and FIG. 10A follows FIG. 9C.

As shown in FIG. 8A, for example, the contact point electrode 71 and the insulating layer 4 are formed on the insulating layer 5 with a thickness of 0.5 μm provided on the major surface of the base substance 2. The insulating layer 3 and the insulating layer 4 can be based on, for example, a $SiO_2$ film formed by a CVD method. The contact point electrode 71 can be based on a titanium nitride film with a thickness of 50 nm formed by a reactive sputtering method.

Specifically, the $SiO_2$ film serving as the insulating layer 3 is formed on the major surface of the base substance 2 by the CVD method. Next, the titanium nitride film is formed on the insulating layer 3 by the reactive sputtering method. Furthermore, an etching mask is formed by photo-lithography, and the titanium nitride film is etched using a RIE method (Reactive Ion Etching) to be processed, for example, to the contact point electrode 71 with a dimension of 40 nm×40 nm.

Next, the $SiO_2$ film serving as the insulating layer 4 is formed with a thickness of 3 μm using the CVD method. The $SiO_2$ film is etched using a resist formed in a prescribed shape by the photo-lithography as a mask. At this time, using a gas having etching selectivity such that only $SiO_2$ film is etched, the $SiO_2$ film is dry-etched not so as to damage the contact point electrode 71.

As shown in FIG. 8, a sacrifice layer 32 is formed in a space between the insulating layers 4 to cover the contact point electrode 71. The sacrifice layer 32 can be based on, for example, aluminum oxide ($Al_2O_3$) formed using the sputtering method.

Specifically, the $Al_2O_3$ film with a thickness of 3 μm is formed on the insulating layer 3 having the insulating layer 4 and the contact point electrode 71 formed using the sputtering method. Furthermore, the $Al_2O_3$ film formed on the insulating layer 4 is flattened using a CPM method (Chemical Mechanical Polish).

Next, as shown in FIG. 8C, a nickel layer 34 with a thickness of 1 nm is formed on the insulating layer 3 and the sacrifice layer 32. For example, the sputtering method can be used for forming the nickel layer 34. The nickel layer 34 serves as a catalyst in forming multilayer graphene described later.

Next, as shown in FIG. 8D, multilayer graphene 8g serving as the beam 8 is formed on the nickel layer 34 using the CVD method. For example, using acetylene gas as a source gas, the multilayer graphene 8g with a thickness of 5 nm is formed at a film formation temperature of 500° C. An arbitrary source gas is used and, for example, ethane may be used.

Furthermore, as shown in FIG. 9A, the supporting electrode 16, the facing supporting part 26 and the contact electrode 13 are formed on the multilayer graphene 8g. The supporting electrode 16, the facing supporting part 26 and the contact electrode 13 can be based on, for example, titanium (Ti).

A Ti film with a thickness of 20 nm serving as the supporting electrode 16, the facing supporting part 26 and the contact electrode 13 is formed on the multilayer graphene 8g using the sputtering method and the Ti film is etched using a resist pattern formed by the photo-lithography as a mask. The supporting electrode 16, the facing supporting part 26 and the contact electrode 13 are formed simultaneously after the etching of the Ti film. A size of the contact electrode 13 is, for example, 40 nm×40 nm which is equal to the contact point electrode 71.

In the etching of the Ti film, the multilayer graphene 8g is processed into a prescribed shape. The multilayer graphene 8g is processed into a striped shape so that the length L of the movable part 11 is, for example, 40 nm later.

Next, a workpiece is heated at a temperature of 900° C. in a nitrogen atmosphere. Thereby, Ti is diffused into the multilayer graphene 8g and a metal-carbidized region is selectively formed in a part of the multilayer graphene.

Thereby, as shown in FIG. 9B, the holding part 18, the facing holding part 28 and the control part 12 including the metal-carbidized multilayer graphene are formed. On the other hand, the movable part 11 being not in contact with Ti used for the supporting electrode 16, the facing supporting part 26 and the contact electrode 13 is not metal-carbidized. Thereby, the configuration of the beam 8 illustrated in FIGS. 7A and 7B is formed. The multilayer graphene 8g is meta-carbidized and thus bond between graphene sheets is strengthened in the holding part 18, the facing holding part 28 and the control part 12.

Thus, the multilayer graphene used for the beam 8 can be selectively metal-carbidized by using a metal for the supporting electrode 16. The supporting electrode 16 can be based on at least one selected from the group consisting of Ti, Co, W, Ni, Pt and Ta. Similarly, the facing supporting part 26 and the contact electrode 13 can be based on at least one selected from the group consisting of Ti, Co, W, Ni, Pt and Ta.

Next, as shown in FIG. 9C, an $SiO_2$ film with a thickness of 1 nm serving as the insulating part 19 is formed on the supporting electrode 16, the facing supporting part 26, the contact electrode 13 and the beam 8 by the sputtering method, subsequently a titanium nitride film with a thickness of 1 nm serving as the floating conductive layer 15 is formed, and the insulating part 19 and the floating conductive layer 15 are formed on the contact electrode 13 by the photo-lithography and the etching. A size of the insulating part 19 and the floating conductive layer 15 is, for example, 40 nm×40 nm.

Furthermore, as shown in FIG. 10A, the insulating layer 5 and the insulating layer 25 are formed above the supporting electrode 16 and the facing supporting part 26, respectively, and a sacrifice layer 33 is formed in a space between the insulating layer 5 and the insulating layer 25. The insulating layer 5 and the insulating layer 25 can be based on, for example, an $SiO_2$ formed by the CVD method. The sacrifice layer 33 can be based on an $Al_2O_3$ film.

Specifically, for example, the $SiO_2$ film with a thickness of about 5 nm serving as the insulating layer 5 and the insulating layer 25 is formed on the supporting electrode 16, the facing supporting part 26, the floating conductive layer 15 and the beam 8. Furthermore, this $SiO_2$ film is processed into a shape of the insulating layer 5 and the insulating layer 25 by the photo-lithography and the etching. Thereafter, the $Al_2O_3$ film with a thickness of about 25 nm is formed by the sputtering method, and an upper surface of the $Al_2O_3$ film is processed and flattened by CPM so that a thickness of the $Al_2O_3$ film directly above the floating conductive layer 15 is about 3 nm. A titanium nitride film with a thickness of about 5 nm serving as the control electrode 91 is formed on the flattened upper surface, and the titanium nitride film is processed into 40 nm×40 nm by the photo-lithography and the etching and the control electrode 91 is formed.

Figure 10B:
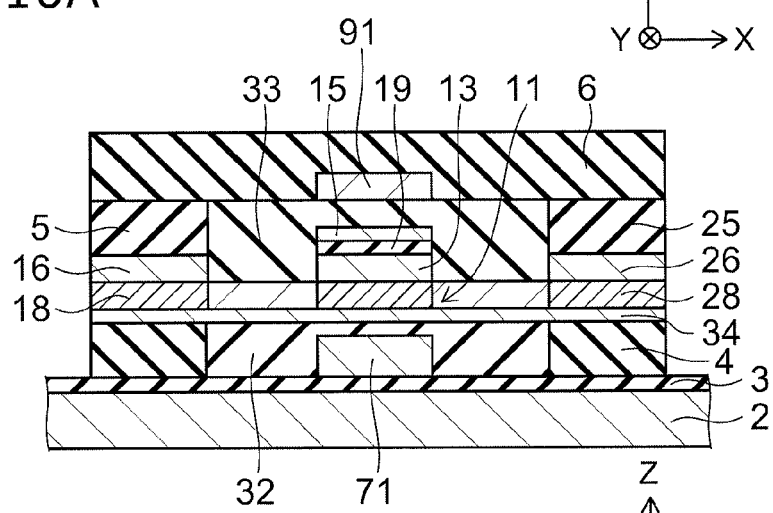

Furthermore, as shown in FIG. 10B, for example, an $SiO_2$ film serving as the insulating layer 6 is formed on the control electrode 91, the sacrifice layer 33 and the insulating layer 5, and this $SiO_2$ film is processed into a striped shape with a width of 40 nm.

Figure 10C:
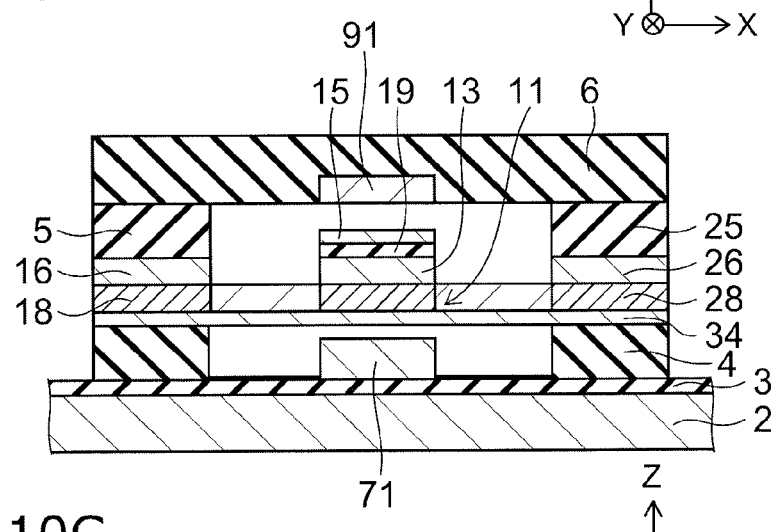

Finally, as shown in FIG. 10C, the sacrifice layer 32 and the sacrifice layer 33 are selectively etched using a hydrochloric acid solution, a hollow interior of the structure body including the insulating layers 3, 4, 5 and 6 is formed, and a structure having the movable part 11 spaced from the base substance 2 is formed. Thus, the switch device 220 illustrated in FIGS. 7A and 7B can be manufactured.

The above manufacturing method is one example and can be variously varied. For example, after the supporting electrode 16, the facing supporting part 26 and the contact electrode 13 are formed in the prescribed shape before forming the nickel layer 34, the sacrifice layer is buried between them, and after that the supporting electrode 16, the facing supporting part 26 and the contact electrode 13 are exposed and the nickel layer 34 and the multilayer graphene 8g are formed on them and subsequently subjected to a heat treatment. Thereby, portions of the multilayer graphene 8g facing the supporting electrode 16, the facing supporting part 26 and the contact electrode 13 can also be selectively metal-carbidized.

Each material described above is one example, and for example, the sacrifice layer 32 and the sacrifice layer 33 can be based on various insulating layers, materials serving as various electrodes and arbitrary materials having an etching selectivity to the multilayer graphene.

Figure 11:
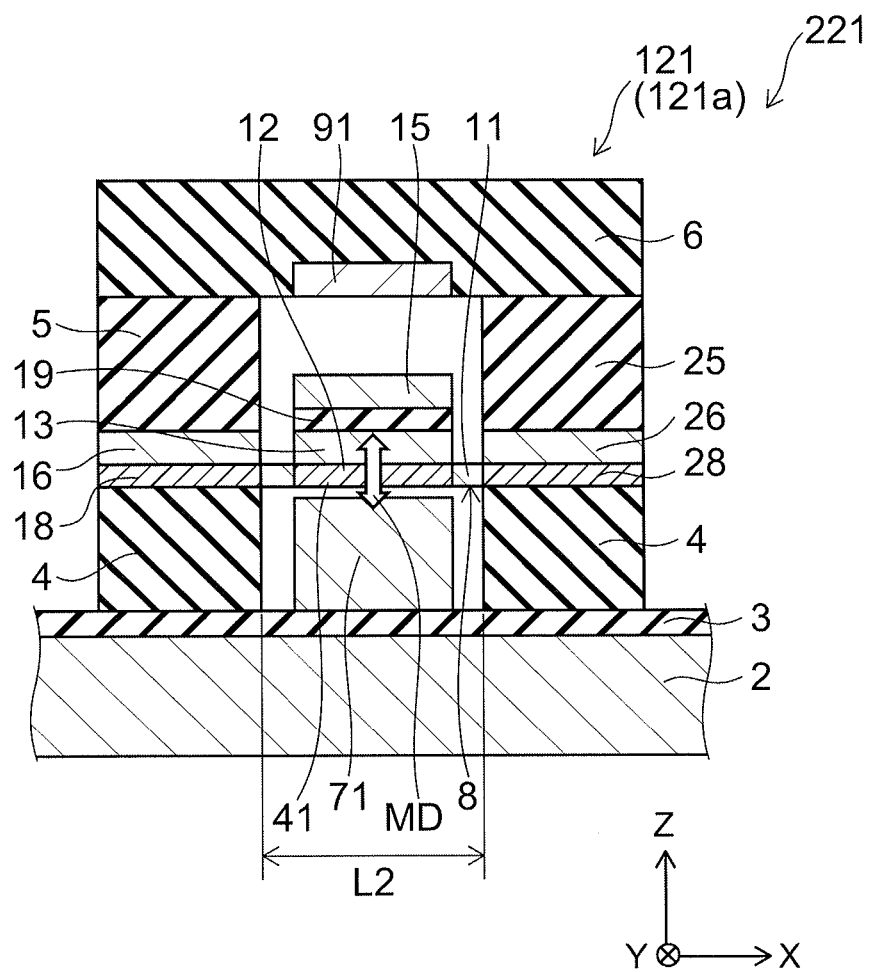
FIG. 11 is a schematic view showing a switch device.

FIG. 11 is a schematic sectional view illustrating the configuration of another switch device according to the second embodiment.

As shown in FIG. 11, in a switching unit 121 (first switching unit 121a) of another switch device 221 according to the embodiment, a length L2 of the movable part 11 is reduced from the length L1 of the movable part 11 in the switching unit 120.

Because the length L2 of the movable part 11 is reduced from that of the switching unit 120, a size of the switching unit 121 is reduced from a size of the switching unit 120. This allows a packing density to be increased in application of the switch device to a circuit.

The length L2 of the movable part 11 is set to be short like the switching unit 121, and thereby a highly integrated NAND flash memory having a memory size of a minimum physical size, 4 $F^2$, can be realized in the case of setting a minimum process dimension to F.

Third Embodiment

Figure 12A:
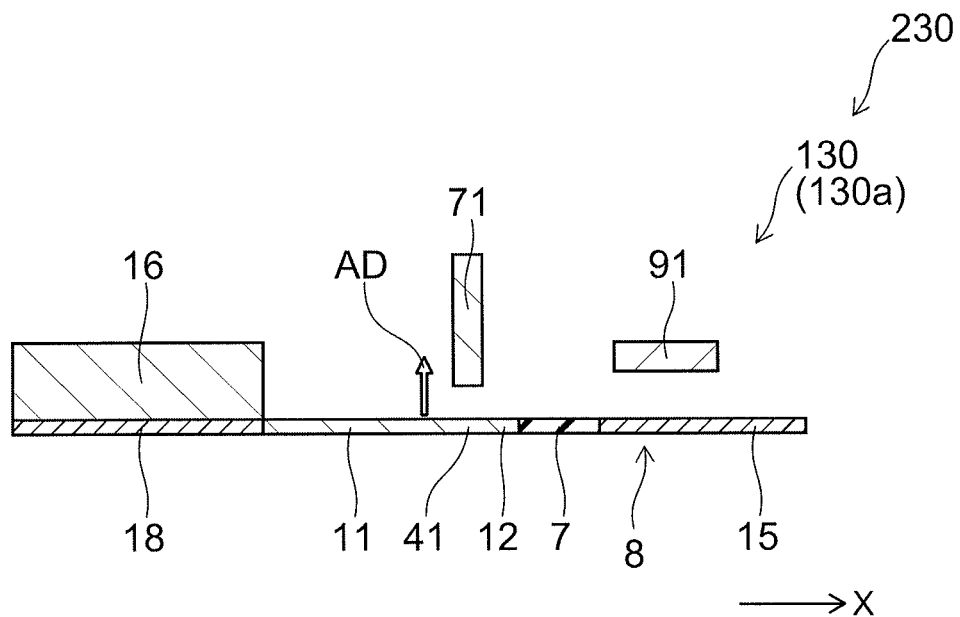
FIGS. 12A and 12B are schematic sectional views showing switch devices.
Figure 12B:
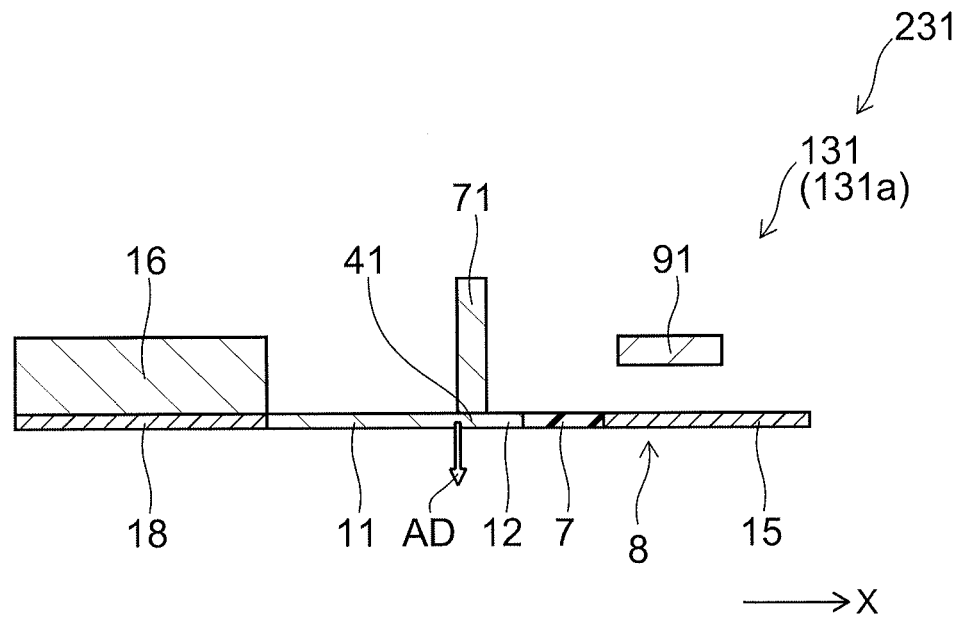

FIGS. 12A and 12B are schematic sectional views illustrating a switch device according to a third embodiment of the invention.

As shown in FIG. 12A, a switching unit 130 (first switching unit 130a) of the switch device 230 according to the embodiment also includes the supporting electrode 16, the contact point electrode 71, the beam 8, the control electrode 91 and the floating conductive layer 15.

Also in the specific example, the supporting electrode 16, the contact point electrode 71 and the control electrode 91 are fixed to the base substance 2, but the base substance 2 is omitted. That is, the relative relationship between the supporting electrode 16, the contact point electrode 71, the beam 8, the control electrode 91 and the floating conductive layer 15 and the base substance 2 is arbitrary, and in the following the mutual relationship of the disposal of the supporting electrode 16, the contact point electrode 71, the beam 8, the control electrode 91 and the floating conductive layer 15 will be described.

The floating conductive layer 15 is annexed to the control part 12 of the movable part 11 via an insulating part 7, and stores charges. However, in the switching unit 130, the floating conductive layer 15 is provided along the extending direction of the beam 8 in generally one plane with the movable part 11.

The control part 12 is disposed at the tip of the beam 8 on the opposite side to the holding part 18, and the insulating portion 7 is provided in substantially one plane with the beam 8. The floating conductive layer 15 is provided on an opposite side to the control part 12 of the insulating part and in substantially one plane with the beam 8.

In the specific example, the beam 8, the insulating part 7 and the floating conductive layer 15 are in one layer, and the insulating part 7 and the floating conductive layer 15 can be formed of the multilayer graphene serving as the beam 8. For example, the insulating part 7 can be formed by selectively irradiating the multilayer graphene with an electron beam and by introducing defects into the multiplayer graphene. The multilayer graphene serving as the beam 8 can be metal-carbidized to be used for the floating conductive layer 15.

In this case, because graphenes are bonded by the metal-carbidized multilayer graphene serving as the floating conductive layer 15, the control part 12 may not be metal-carbidized. The control part 12 may include the metal-carbidized multilayer graphene in order to achieve tighter bond. The insulating part 7 extends to immediately below the control electrode 91 to and thus defect site contained in the insulating part 7 may store charges on behalf of the floating conductive layer 15.

The floating conductive layer 15 and the movable part 11 are electrically separated by the insulating part 7.

In the switching unit 130, for example, the supporting electrode 16 can be caused to function as the input electrode, the contact point electrode 71 can be caused to function as the output electrode and the control electrode 91 can be caused to function as the gate electrode.

In the switching unit 130, the contact point electrode 71 and the movable part 11 are separated in a state of not applying the electrical signal to the control electrode 91. For example, the movable part 11 is deformed in a direction toward the contact point electrode 71 (a direction of an arrow AD in FIG. 12A) to bring the contact point part 41 into contact with the contact point electrode 71 by attracting the floating conductive layer 15 to the control electrode 91 with an electrostatic force. Thereby, a conduction state is achieved between the supporting electrode 16 and the contact point electrode 71. That is, if the multilayer graphene serving as the beam 8 is provided by the layer number NL forming a volatile switch, operation similar to a normally-off type NMOS can be achieved.

As shown in FIG. 12B, also in the switching unit 131 (first switching unit 131a) of another switch device 231 according to the embodiment, the floating conductive layer 15 is provided along the extending direction of the beam 8 in generally one plane with the control part 12.

Also in the switching unit 131, for example, the supporting electrode 16 can be caused to function as the input electrode, the contact point electrode 71 can be caused to function as the output electrode and the control electrode 91 can be caused to function as the gate electrode.

In this case, the contact point electrode 71 and the contact point part 41 contact each other in a state of not applying the electrical signal to the control electrode 91. The electrical signal (for example, voltage) is applied to the control electrode 91 to produce the repulsive force Fr between the control electrode 91 and the floating conductive layer 15. Thereby, the movable part 11 is deformed in a direction getting away from the contact point electrode 71 (a direction of an arrow AD in FIG. 12B) to make separate the contact point electrode 71 from the contact point part 41. Thereby, a non-conduction state is achieved between the supporting electrode 16 and the contact point electrode 71, and operation similar to a normally on type PMOS can be achieved.

As described above, use of the switching unit 130 and the switching unit 131 according to the embodiment allows the switching operation similar to the NMOS type and PMOS type to be performed. Without necessity of a complicate circuit including a lot of transistors such as a MOS type switch, a similar operation can be achieved by the simple configuration, and power consumption can be reduced.

In this case, the switching unit 130 and the switching unit 131 can be provided on one base substance 2. This improves integration and also reliability. When the switching unit 130 and the switching unit 131 are provided on one base substance 2, the switching unit 130 and the switching unit 131 can be juxtaposed in a plane parallel to the major surface of the base substance 2, and the switching unit 130 and the switching unit 131 may be stacked each other along a direction perpendicular to the major surface of the base substance 2.

Also in the switching unit 130 and the switching unit 131 according to the embodiment, it is desired that the layer number NL of the multilayer graphene used for the movable part 11 is set so that the elastic force $F_B$ exceeds the van del Waal's force $F_A$, and the volatile switch is desired to be set.

Charge injection into the floating conductive layer 15 can be performed by applying high voltage to the control electrode 91 to deform the movable part 11 greatly and by bringing the floating conductive layer 15 into contact with the control electrode 91. A width of the insulating part 7 (the length along the extending direction of the beam 8, namely the length along the X-axis direction) is set narrow and a tunnel current may be passed through from the movable part 11 to the floating conductive layer 15 to store charges.

Figure 13A:
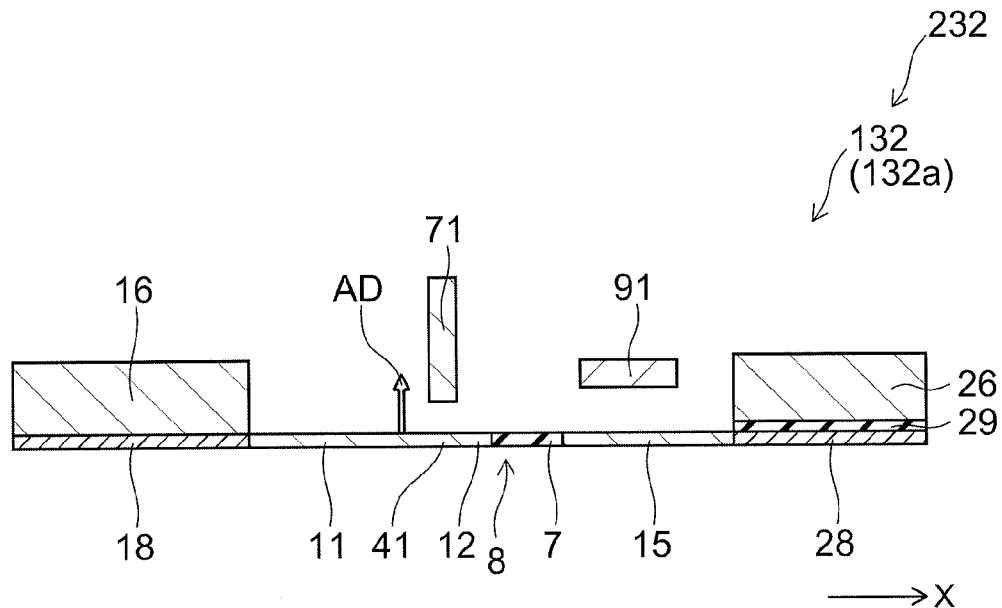
FIGS. 13A and 13B are schematic sectional views showing switch devices.
Figure 13B:
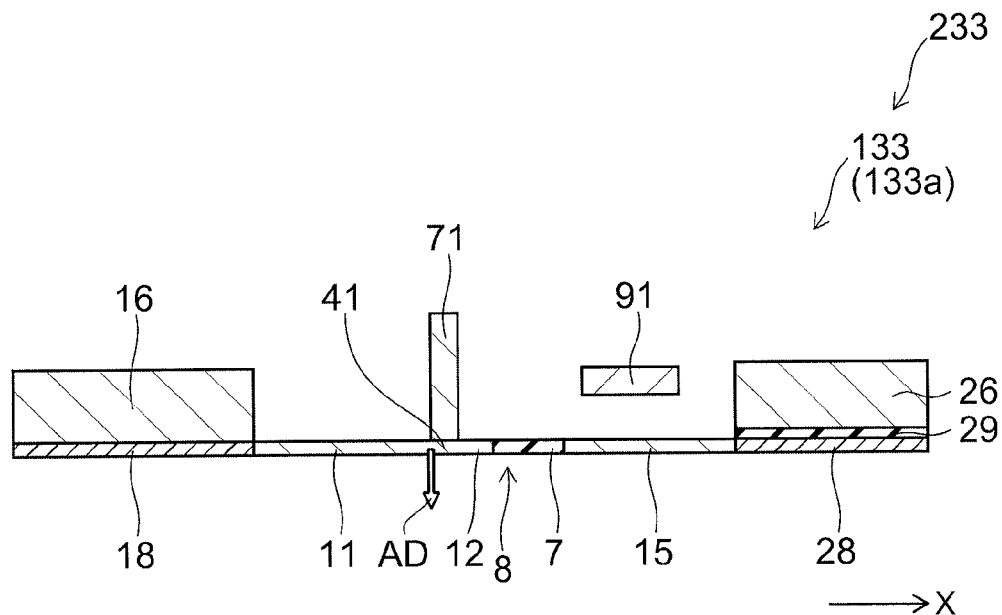

FIGS. 13A and 13B are schematic sectional views illustrating the configuration of another switch device according to the third embodiment of the invention.

As shown in FIG. 13A, a switching unit 132 (first switching unit 132a) of the switch device 232 according to the embodiment is an example where the facing supporting part 26 is further provided in the configuration of the switching unit 130 and the beam 8 further includes the facing holding part 28 provided on the opposite side to the holding part 18 of the movable part 11. In other words, the beam 8 is fixed to supporting electrode 16 and the facing supporting part 26 by the holding part 18 and the facing holding part 29, respectively. In this example, the facing supporting part 26 is conductive and the facing supporting part 26 not only supports the facing holding part 28 but also has function as an electrode.

In the switching unit 132, the insulating part 7 is provided on the end of the movable part 11 (end on an opposite side to the holding part 18) and the floating conductive layer 15 is provided on an opposite side to the holding part 18 of the insulating part 7. Thereby, the movable part 11 electrically connected to the supporting electrode 16 is separated from the floating conductive layer 15.

An insulating film 29 (first insulating film) functioning as a tunnel insulating film is provided between the facing holding part 28 and the facing supporting part 26.

In other words, in the specific example, the facing holding part 28 on an opposite side to the holding part 18 of the movable part 11 is fixed to the base substance 2 and includes the metal-carbidized multilayer graphene. The switching unit 132 is fixed to the base substance 2, and further includes the conductive facing supporting part 26 having the facing holding part 28 fixed and the insulating film 29 provided between the facing supporting part 26 and the facing holding part 28.

Thereby, the floating conductive layer 15 is connected to the conductive facing supporting part 26 via the facing holding part 28 and the insulating film 29. In this configuration, application of the electrical signal (for example, voltage) to the facing supporting part 26 allows charges to be injected into the floating conductive layer 15. Furthermore, application of the voltage between the charged floating conductive layer 15 and the control electrode 91 generates the suction force Fa to deform the movable part 11 in a direction (direction of an arrow AD in FIG. 13A) toward the contact point electrode 71 and performs the switching operation.

Also in the switching unit 132, for example, the supporting electrode 16 can be caused to function as the input electrode, the contact point electrode 71 can be caused to function as the output electrode, and the control electrode 91 can be caused to function as the gate electrode.

In the switching unit 132, when the electrical signal (for example, voltage) is not applied to the control electrode 91, the contact point electrode 71 and the contact point part 41 are separated each other and the contact point electrode 71 and the supporting electrode 16 are not in a conduction state, namely in a normally off state. The electrical signal (for example, voltage) is applied to the control electrode 91, the contact point electrode 71 is brought into contact with the contact point part 41, and the contact point electrode 71 and the supporting electrode 16 are brought into conduction.

On the other hand, as shown in FIG. 13B, in a switching unit 133 (first switching unit 133a) of a switch device 233 according to the embodiment, in a state of not applying the voltage to the control electrode 91, the contact point electrode 71 and the contact point part 41 are in contact with each other and the contact point electrode 71 and the contact point part 41 are in a conduction state.

Also in the switching unit 133, for example, the supporting electrode 16 can be caused to function as the input electrode, the contact point electrode 71 can be caused to function as the input electrode and the control electrode 91 can be caused to function as the gate electrode.

In the switching unit 133, for example, if the repulsive force Fr is generated between the control electrode 91 and the floating conductive electrode 15, the movable part 11 deforms in a direction (a direction of an arrow AD in FIG. 13B) separating from the contact point electrode 71, the contact point electrode 71 and the contact point part 41 are separated each other, and the contact point electrode 71 and the supporting electrode 16 are in a non-conduction state. That is, a normally on switching operation is performed.

As described above, the switching unit 132 and the switching unit 133 can realize a switching operation similar to MNOS type normally off and PMOS type normally on. The layer number NL of the multilayer graphene of the movable part 11 is desired to be set to a layer number NL making the volatile operation possible.

In the switching unit 132 and the switching unit 133, the supporting electrode 16 functioning as the input electrode is connected to the floating conductive layer 15 in series. High voltage "H (High)" or low voltage "L (Low)" is applied to the floating conductive layer 15, and fixed voltage is input to the facing supporting part 26 serving as a back gate. At this time, a threshold value of the switching operation can be adjusted by the applied voltage to the facing supporting part 26.

Fourth Embodiment

Figure 14:
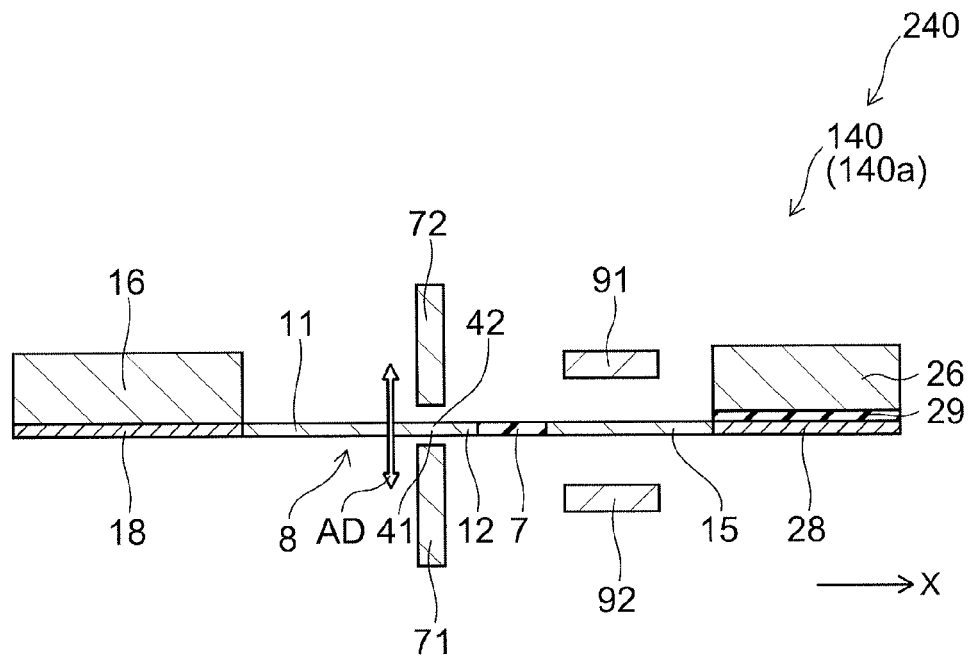
FIG. 14 is a schematic view showing a switch device.

FIG. 14 is a schematic sectional view illustrating the configuration of a switch device according to a fourth embodiment.

As shown in FIG. 14, a switching unit 140 (first switching unit 140a) of the switch device 240 according to the embodiment further includes a facing contact point electrode 72 (first facing contact point electrode) and a facing control electrode 92 (first facing control electrode). The movable part of the beam 8 further includes a facing contact point part 42 (first facing contact point part).

The facing contact point part 42 is provided on an opposite side to a side facing the contact point electrode 71 of the movable part 11. In the specific example, the facing contact point part is an opposite plane to a plane serving as the contact point part 41 of the movable part 11.

The facing contact point electrode 72 is fixed to the base substance 2 not shown, is provided on an opposite side to the contact point electrode 71 of the beam 8, and faces the facing contact point part 42.

The facing control electrode 92 is fixed to the base substance 2 not shown, is provided on an opposite side to the control electrode 91 of the beam 8, and faces the floating conductive layer 15. The facing control electrode 92 puts the facing contact point part 42 into a contact state or non-contact state with respect to the facing contact point electrode 72 depending on applied facing electrical signal (first facing electrical signal).

In the switching unit 140, interaction between the floating conductive layer 15 and the control electrode 91 and interaction between the floating conductive layer 15 and the facing control electrode 92 put the contact point part 41 and the facing contact point part 42 of the movable part 11 into a contact state or non-contact state with respect to the contact point electrode 71 and the facing contact point electrode 72, respectively.

The holding part 18 and the facing holding part 28 of the beam 8 are connected to the supporting electrode 16 and the facing supporting part 26, respectively. The multilayer graphene is metal-carbidized in the holding part 18 and the facing holding part 28 of the beam 8.

For example, when the movable part 11 (contact point part 41) contacts the contact point electrode 71, or when the movable part 11 (facing contact point part 42) contacts the facing contact point electrode 72, the layer number NL of the multilayer graphene of the movable part 11 is set so that the elastic force $F_B$ of the movable part 11 is greater than the van del Waal's force $F_A$ between the movable part 11 (contact point part 41) and the contact point electrode 71 and the van del Waal's force $F_A$ between the movable part 11 (facing contact point part 42) and the facing contact point electrode 72. Thereby, the contact between the movable part 11 and the contact point electrode 71 or the facing contact point electrode 72 becomes volatile.

The suction force Fa or the repulsive force Fr is generated between the floating conductive layer 15 and the control electrode 91 and between the floating conductive layer 15 and the facing control electrode 92, and the movable part 11 can be deformed. Thereby, the control electrode 91 and the facing control electrode 92 bring the movable part 11 into contact one of the contact point electrode 71 and the facing contact point electrode 72, and control the electrical contact between the supporting electrode 16 and one of the contact point electrode 71 and the facing contact point electrode 72.

For example, if negative voltage is applied to the facing supporting part 26 connected to the floating conductive layer 15 side of the movable part 11, electrons having negative charge are injected via the insulating film 29 and the floating conductive layer 15 is negatively charged. Therefore, positive voltage is alternately applied to the control electrode 91 and the facing control electrode 92, the suction force Fa is alternately operated between the floating conductive layer 15 and the control electrode 91 and between the floating conductive layer 15 and the facing control electrode 92, and the movable part 11 is deformed in the direction (arrow AD in FIG. 13A) toward the contact point electrode 71 or the facing contact point electrode 72. Thereby, contact and separation between the movable part 11 and the contact point electrode 71 and between the movable part 11 and the facing contact point electrode 72 are controlled, and electrical continuity between the supporting electrode 16 and the contact point electrode 71 and between the supporting electrode 16 and the facing contact point electrode 72 is controlled by the control electrode 91 and the facing control electrode 92.

Also in the switching unit 140, the supporting electrode 16 and the floating conductive layer 15 are connected in series. In the switching unit 140, for example, the contact point electrode 71 and the facing contact point electrode 72 can be caused to function as two input electrodes. For example, if power-supply voltage Vdd is input to the contact point electrode 71 and the facing contact point electrode 72 is ground, electrical signal with reverse polarity to the electrical signal input the control electrode 91 and the facing control electrode 92 can be output from the supporting electrode 16. Thereby, for example, the function of CMOS inverter (inverting circuit) can be achieved by one switching unit 140, and an electric circuit is highly integrated with ease.

Figure 15:
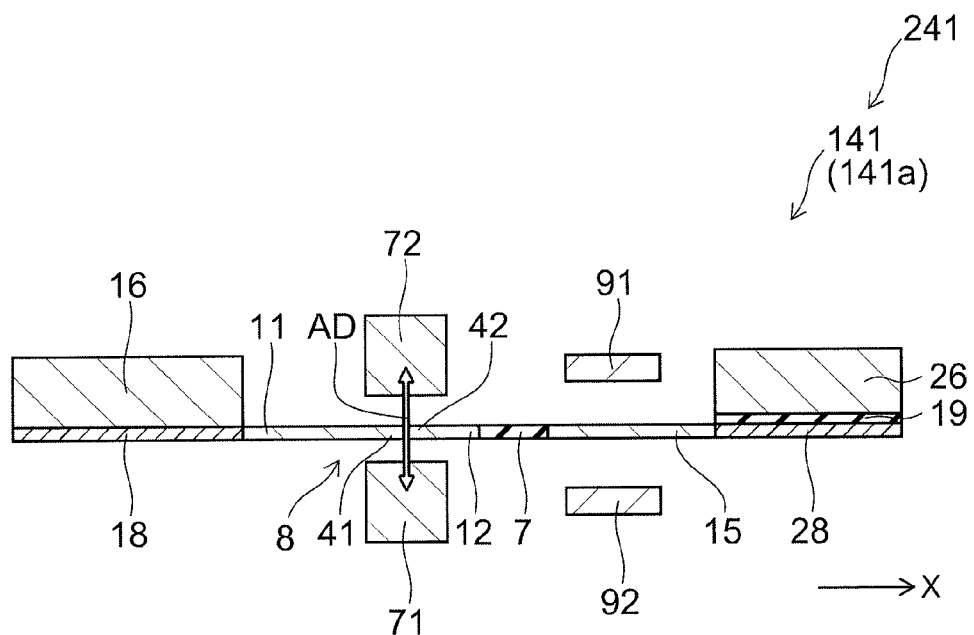
FIG. 15 is a schematic view showing a switch device.

FIG. 15 is a schematic sectional view illustrating the configuration of another switch device according to the fourth embodiment of the invention.

As shown in FIG. 15, the configuration of a switching unit 141 (first switching unit 141a) of the switch device 241 according to the embodiment is similar to the switching unit 140. However, the operation of the switching unit 141 is different from the operation of the switching unit 140.

In the switching unit 141, for example, the supporting electrode 16 can be caused to function as the input electrode and the contact point electrode 71 and the facing contact point electrode 72 can be caused to function as two output electrodes. The electrical signal input to the supporting electrode 16 can be output from one of the contact point electrode 71 and the facing contact point electrode 72 by the electrical signal input to the control electrode 91 and the facing control electrode 92. That is, the output is selected by combination of voltage applied to the control electrode 91 and the facing control electrode 92.

In other words, the switching unit 141 has a function of a demultiplexer. If the demultiplexer is configured by CMOS transistor, a complex circuit configuration including many devices is needed and power consumption is large, but according to the switching unit 141 of the embodiment, the configuration is simple and highly integrated low power consumption demultiplexer can be achieved.

Fifth Embodiment

Figure 16:
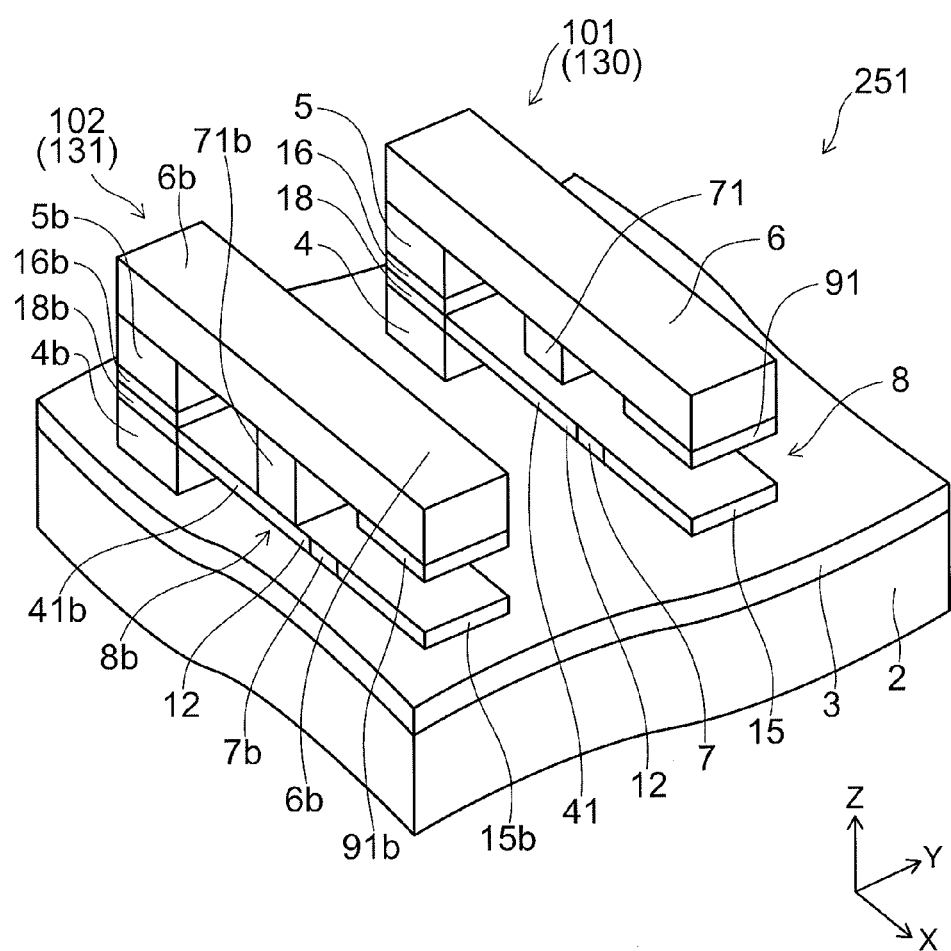
FIG. 16 is a schematic perspective view showing a switch device.

FIG. 16 is a schematic perspective view illustrating the configuration of a switch device according to a fifth embodiment of the invention.

As shown in FIG. 16, the switch device according to the embodiment 251 further includes a second switching unit 102 in addition to the first switching unit 101.

The switching unit 101 can be based on one of the switching units according to the embodiments of the invention already described. Here, the case where the switching unit 130 described with regard to FIG. 12A is used for the first switching unit 101 is described. That is, in the switching unit 130 being the first switching unit 101, the movable part 11 is illustratively displaced in the Z-axis direction. The configuration and the operation of the switching unit 130 being the switching unit 101 has been described in FIGS. 7A and 7B, and then omitted here.

The second switching unit 102 includes a second beam 8b including a second supporting electrode 16b fixed to the base substance 2 provided with the first switching unit 101, a second holding part 18b supported by the base substance 2, electrically connected to the second supporting electrode 16b, and including the metal-carbidized multilayer graphene, and a second movable part 11b extending from the second holding part 18b, separated from the base substance 2, and including the multilayer graphene, a second contact point electrode 71b fixed to the base substance 2 and facing the second movable part 11b, a second floating conductive layer 15b annexed to the second movable part 11b via a second insulating part 7b and storing a charge, and a second control electrode 91b fixed to the base substance 2, facing the second floating conductive layer 15b and putting the second movable part 11b into a contact state or non-contact state to the second contact point electrode 71b depending on an applied second electrical signal.

The second switching unit 102 can be based on one of the switching units according to the embodiments already described. Here, the case where the switching unit 131 described in FIG. 12B is used for the second switching unit 102 is described. That is, in the switching unit 131 being the second switching unit 102, the second movable part 11b is illustratively displaced in the Z-axis direction.

When the first electrical signal is not applied to the first control electrode (control electrode 91) of the first switching unit 101, the first contact point part (first contact point part 41) is separated from the first contact point electrode (contact point electrode 71). When the second electrical signal is not applied to the second control electrode 91b of the second switching unit 103, a second contact point part 41b is in contact with the second contact point electrode 71b.

In this way, the switching unit 130 operable similar to the normally off NMOS is used as the first switching unit 101 and the switching unit 131 operable similar to the normally on PMOS is used as the second switching unit 103, and thereby various electrical circuits can be constructed. For example, CMOS type operation operating complementarily becomes possible.

Providing the first switching unit 101 and the second switching unit 102 on the base substance 2, for example, allows a circuit to be scaled down and the reliability is also improved.

The first switching unit 101 and the second switching unit 102 may be connected in parallel and may be connected in series. At least one of the first supporting electrode (supporting electrode 16), the first contact point electrode (contact point electrode 71) and the first control electrode (control electrode 91) included in the first switching unit 101 is connected to at least one of the second supporting electrode 16b, the second contact point electrode 71b and the second control electrode 91b included in the second switching unit 102, and then various operations can be performed.

In the specific example, the extending direction of the beam 8 (first beam) of the first switching unit 101 and the extending direction of the second beam 8b of the second switching unit 102 are parallel each other, but the extending directions of these beams may be perpendicular and each other's relationship is arbitrary.

In the specific example, the first switching unit 101 and the second switching unit 102 are placed in the same plane parallel to the major surface of the base substance 2, but the first switching unit 101 and the second switching unit 102, for example, may be stacked in the Z-axis direction.

For example, the switching unit 132 illustrated in FIG. 13A may be used as the first switching unit 101 and the switching unit 133 illustrated in FIG. 13B may be used as the switching unit 102.

Figure 17:
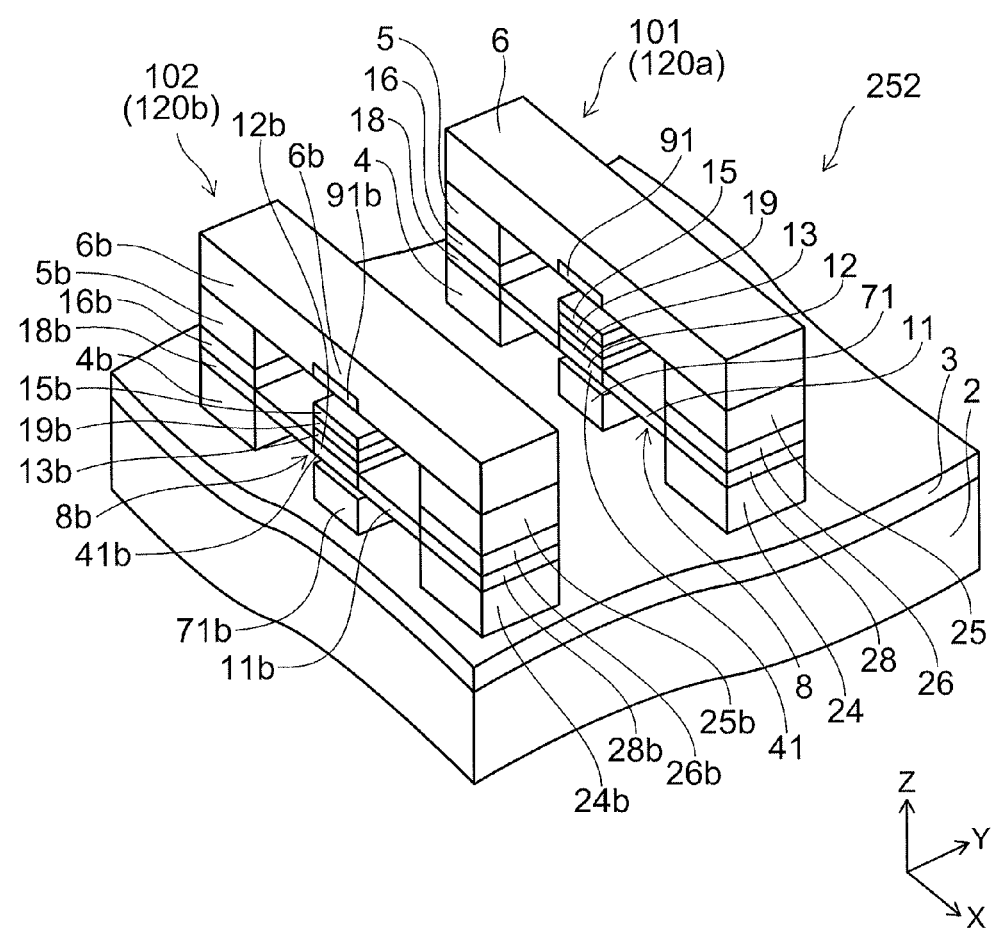
FIG. 17 is a schematic perspective view showing a switch device.

FIG. 17 is a schematic perspective view illustrating the configuration of another switch device according to the fifth embodiment of the invention.

As shown in FIG. 17, the switch device 252 according to the embodiment also further includes the switching unit 102 in addition to the first switching unit 101.

This is the example where the first switching unit 101 performs the volatile switching operation and the second switching unit 101 performs the non-volatile operation.

The first switching unit can be based on one of the switching units according to the embodiments already described. Here, the case where the first switching unit 120a (switching unit 120) described in FIGS. 7A and 7B is used as the first switching unit 101 is described. The configuration and the operation of the switching unit 120a being the switching unit 101 are described in FIGS. 7A and 7B and then omitted.

Also in this case, the second switching unit 102 includes the second beam 8b including the second supporting electrode 16b fixed to the base substance 2 provided with the first switching unit 101, the second holding part 18b fixed to the base substance 2, electrically connected to the second supporting electrode 16b and including the metal-carbidized multilayer graphene, and the second movable part 11b having one end connected to the second holding part 18b, separated from the base substance 2 and including the multilayer graphene, the second contact point electrode 71b fixed to the base substance 2, facing the second movable part 11b, the second floating conductive layer 15b annexed to the second movable part 11b via the second insulating part 7b and storing charges, and the second control electrode 91b fixed to the base substance 2, facing the second floating conductive layer 15b and putting the second movable part 11b into a contact state or non-contact state to the second contact point electrode 71b depending on the applied second electrical signal.

The second switching unit 102 can be based on one of the switching units according to the embodiments already described. Here, the case where a switching unit 120b having the configuration similar to the switching unit 120 described in FIGS. 7A and 7B is used for the second switching unit 102 is described.

In other words, in the specific example, the switching unit 102 further includes a second facing supporting part 26b fixed to the base substance 2, and the second beam 8b further includes a second facing holding part 28b provided on an end of the second movable part 11b opposite to the second holding part 18b. The second facing holding part 28b is fixed to the second facing supporting part 26b and includes the metal-carbidized multilayer graphene. In the specific example, the second facing supporting part 26b is electrically conductive and has also a function as an electrode.

Specifically, in the second witching unit 102, an insulating layer 4b is provided on the insulating layer 3 provided on the base substance 2, the second holding part 18b of the second beam 8b is provided on the insulating layer 4b, the second supporting electrode 16b supporting the second beam 8b is provided on the second holding part 18b, and an insulating layer 5b is provided on the second supporting electrode 16b. An insulating layer 24b is provided on the insulating layer 3, the second facing holding part 28b is provided on the insulating layer 24b, the second facing supporting part 26b supporting the second beam 8b is provided on the second facing holding part 28b, and an insulating layer 25b is provided on the second facing supporting part 26b. An insulating layer 6b is provided on the insulating layer 5b and the insulating layer 25b. The second control electrode 91b is provided on the second movable part 11b side of the insulating layer 6b.

The second movable part 11b of the beam 8b is provided between the second holding part 18b and the second facing holding part 28b. The second contact point part 41b is provided on the base substance 2 side of the second movable part 11b, and the second contact point electrode 71b is provided on the insulating layer 3 on the base substance 2 so as to face the second contact point part 41b.

On an opposite side to the base substance 2 of the second movable part 11b, a second contact electrode 13b is provided on a second control part 12b of the second movable part 11b, a second insulating part 19b is provided on the second contact electrode 13b and the second floating conductive layer 15b is provided on the second insulating part 19b. The second floating conductive layer 15b and the second control electrode 91b face each other.

An elastic force of the first movable part (movable part 11) of the first switching unit 101 is larger than a first van del Waal's force operating between the movable part 11 and the contact point electrode 71 when the first movable part (movable part 11) and the first contact point electrode (contact point electrode 71) contact each other. That is, the first switching unit 101 is a volatile switching unit.

An elastic force of the second movable part 11b of the second switching unit 102 is smaller than a second van del Waal'a force operating between the second movable part 11b and the second contact point electrode 71b when the second movable part 11b and the second contact point electrode 71b contact each other. That is, the second switching unit 102 is a non-volatile switching unit.

In this way, various configurations of circuits can be constructed from the switch device including the volatile switching unit and the non-volatile switching unit.

In other words, also in this case, the first switching unit 101 and the second switching unit 102 may be connected in parallel and may be connected in series. At least one of the first supporting electrode (supporting electrode 16), the first facing supporting part (facing supporting part 26), the first contact point electrode (contact point electrode 71), the first facing contact point electrode (facing contact point electrode 72), the first control electrode (control electrode 91) and the first facing control electrode (facing contact point electrode 92) included in the first switching unit 101 is connected to at least one of the second supporting electrode 16b, the second facing supporting part 26b, the second contact point electrode 71b, the second facing contact point electrode 72b, the second control electrode 91b and the second facing control electrode 92b, and then various operation can be performed.

Figure 18A:
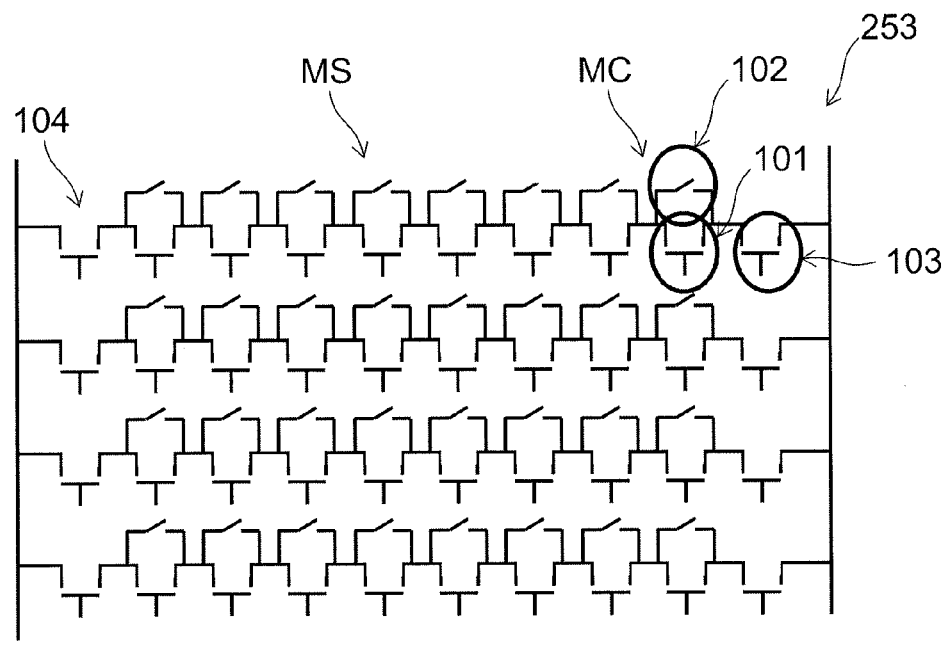
FIGS. 18A and 18B are schematic views showing a circuit including the switch devices.
Figure 18B:
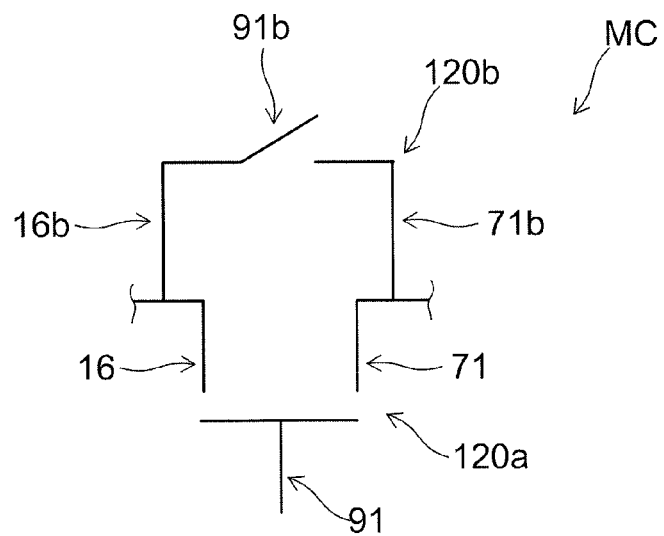

FIGS. 18A and 18B are schematic views illustrating the configuration of another circuit according to the fifth embodiment of the invention.

In other words, FIG. 18A is a circuit diagram illustrating the whole configuration of the circuit 253 according to the embodiment, and FIG. 18B illustrates one of elements included in the circuit 253.

As shown in FIG. 18A, the circuit 253 according to the embodiment is a circuit including the volatile first switching unit 101 and the non-volatile second switching unit 102. The circuit 253 is a NAND type flash memory circuit having a memory cell including the first switching unit 101 and the second switching unit 102. In the specific example, the first switching unit 101 and the second switching unit 102 connected in parallel form one memory cell MC.

One of the switching units according to the embodiments can be used for the first switching unit 101 and the second switching unit 102.

For example, as shown in FIG. 18B, in one memory cell MC, the first supporting electrode (supporting electrode 16) of the first switching unit 101 is electrically connected to the second supporting electrode 16b of the second switching unit 102. The first contact point electrode (contact point electrode 71) of the first switching unit 101 is electrically connected to the second contact point electrode 71b of the second switching unit 102. Thereby, one memory cell MC forms a non-volatile memory part.

A size of one memory element can be 4 $F^2$ by using the switch device 221, and a high-density memory can be realized.

As illustrated in FIG. 18A, a plurality of memory cells MC having this configuration are connected in series, a third switching unit 103 and a fourth switching unit 104 are connected to both ends of the memory cells MC, and one memory string MS is formed. An arbitrary switching unit performing the volatile operation of the switching units according to the embodiments can be used for the third switching unit 103 and the fourth switching unit 104.

The first control electrode (control electrode 91) of the first switching unit 101 and the second control electrode 91b of the second switching unit 102 are controlled by an interconnection not shown. The switch devices using the volatile switching units according to the embodiments can also be used for a column decoder and a row decoder controlling the switching operation by applying the voltage to the interconnection.

The first switching unit 101 and the second switching unit 102 included in the circuit 253 may be placed in a plane parallel to the major surface of the base substance 2, and may be stacked in a direction perpendicular to the major surface of the base substance 2. In the following, an example of the configuration of stacking will be described.

Figure 19:
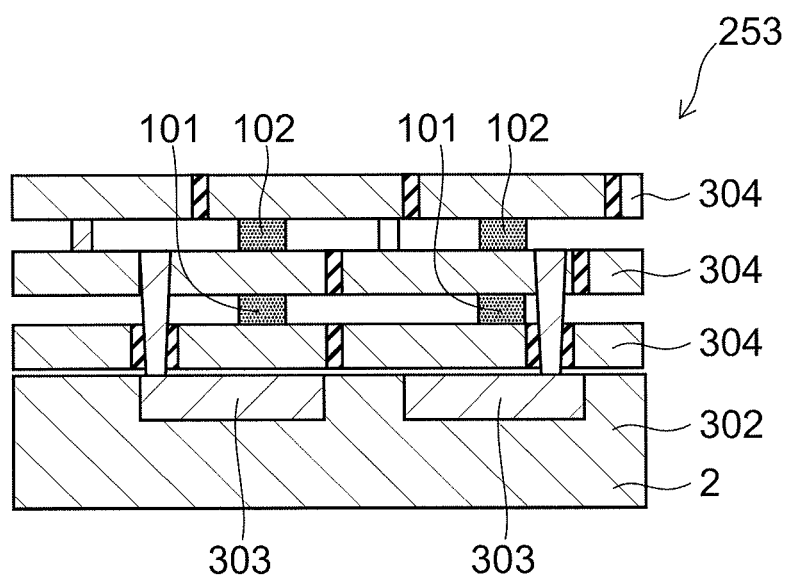
FIG. 19 is a schematic sectional view showing the circuit including the switch devices.

FIG. 19 is a schematic sectional view illustrating the configuration of another switch circuit according to the fifth embodiment of the invention.

As shown in FIG. 19, the switch circuit 253 includes, for example, a structure where the volatile first switching unit 101 and the non-volatile switching unit 102 as stacked on a major surface of a substrate 302. At least part of various conductive layers and electrodes included in the first switching unit 101 and the second switching unit 102 is connected by an interlayer interconnections 304 one another.

In the configuration of stacking the volatile switching unit 101 with the non-volatile switching unit 102, the volatile switching unit 101 and the non-volatile switching unit 102 can be fabricated independently by changing the layer number NL of the multilayer graphene forming the first beam (beam 8) and the second beam 8b in forming respective devices.

In this example, the second switching unit 102 is provided on the first switching unit 101, however stacking order is arbitrary. Stacking number of the first switching unit 101 and the second switching unit 102 is arbitrary, and in the stacking number more than 3 layers, the first switching unit 101 and the second switching unit 102 may be stacked in a arbitrary order.

As illustrated in FIG. 19, in the switch circuit 253, CMOS logic circuit parts 303 are provided on the silicon substrate 302. For example, a low consumption power integrated circuit can be realized by combination of the switch device including the first switching unit 101 and the CMOS logic circuit.

In the case where the volatile first switching unit 101 and the non-volatile second switching unit 102 are placed in the same plane parallel to the major surface of the base substance 2, for example, after the multilayer graphene the first beam (beam 8) forming the volatile first switching unit 101 is formed into a desired thickness, the multilayer graphene of a portion forming the second beam 8b of the non-volatile second switching unit 102 is made thinner, for example, by etching, and thereby the volatile first switching unit 101 and the non-volatile switching unit 102 can be fabricated independently.

Figure 20A:
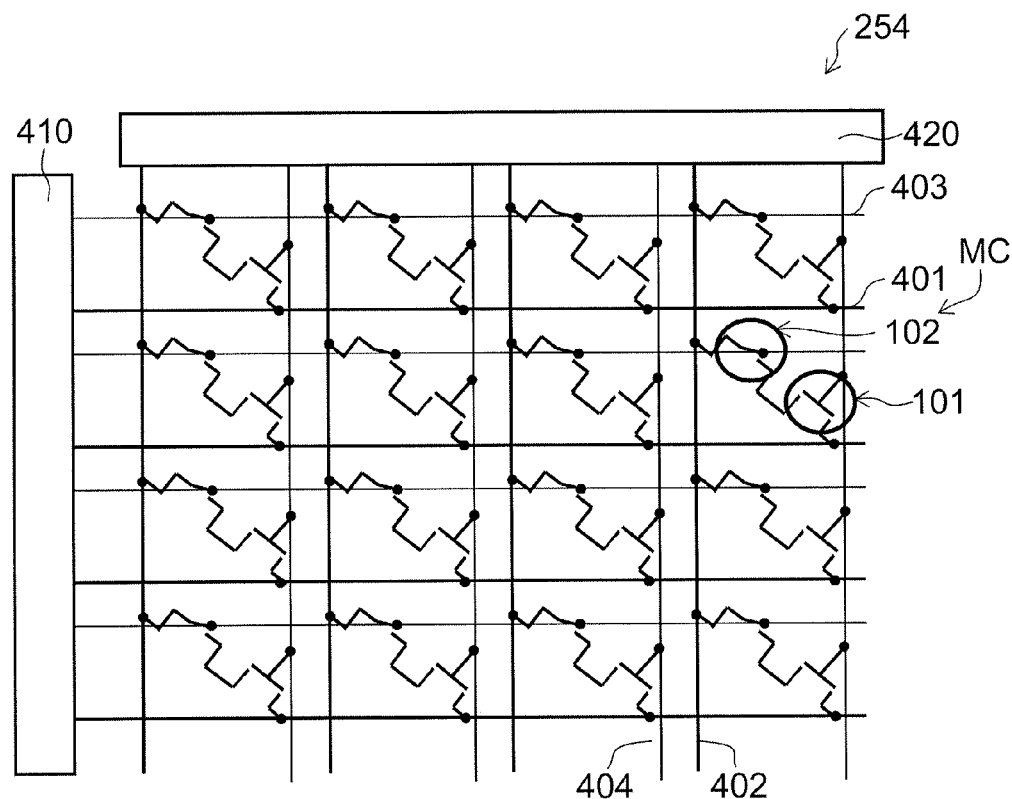
FIGS. 20A and 20B are schematic views showing a circuit including the switch devices.
Figure 20B:
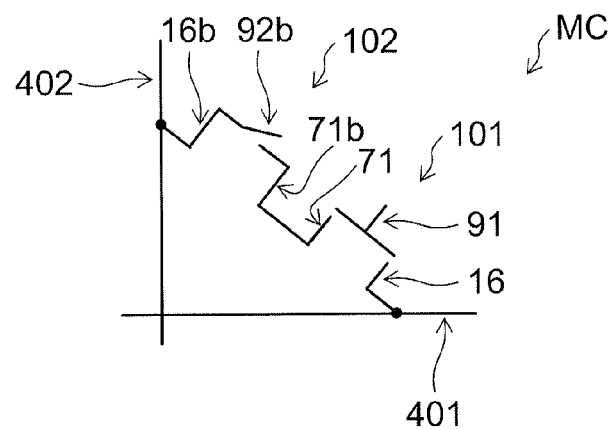

FIGS. 20A and 20B are schematic views illustrating another circuit according to the fifth embodiment of the invention.

In other words, FIG. 20A is a circuit diagram illustrating the whole configuration of the circuit 254 according to the embodiment, and FIG. 20B illustrates one of elements included in the circuit 254.

As shown in FIG. 20A, the circuit 254 is an integrated circuit including the volatile first switching unit 101 and the non-volatile second switching unit 102. The switch circuit 254 is a NOR type flash memory circuit having a memory cell MC including the first switching unit 101 and the second switching unit 102. In the specific example, the first switching unit 101 and the second switching unit 102 connected in series forms one memory cell MC.

One of the switching units according to the embodiments can be used for the switching unit 101 and the second switching unit 102.

As shown in FIG. 20A, a plurality of first interconnects 401 and a plurality of third interconnects 403 extend in a first direction. A plurality of second interconnects 402 and a plurality of fourth interconnects 404 extend in a second direction non-parallel (in the specific example, orthogonal) to the first direction.

The memory cells MC are provided at respective facing portions of the first interconnects 401 and the second interconnects 402.

One end of the first switching unit 101 included in each memory cell MC is connected to the first interconnect 401 and one end of the second switching unit 102 connected in series to the other end of the first switching unit 101 is connected to the second interconnect 402.

The first control electrode (control electrode 91) corresponding to a gate of the first switching unit 101 included in each memory cell MC is connected to the fourth interconnects 404 and the second control electrode 91b corresponding to a gate of the second switching unit 102 is connected to the third interconnect 403.

The first interconnect 401 and the third interconnect 403 are connected to a column decoder 410. The second interconnect 402 and the fourth interconnect 404 are connected to a row decoder 420.

As shown in FIG. 20B, in one memory cell, the first supporting electrode (supporting electrode 16) being one end of the switching unit 101 is connected to the first interconnect 401, the first contact point electrode (contact point electrode 71) is connected to the second contact point electrode 71b of the second switching unit 102, and the second supporting electrode 16b being one end of the second switching unit 102 is connected to the second interconnect 402.

For example, voltage is applied to the second interconnect 402 selected by the row decoder 420, the second floating conductive layer 15b of the second switching unit 102 connected to the row is charged, and gate voltage is applied to the first interconnect 401 selected by the column decoder 410, and thereby the second switching unit 102 at the prescribed position is forced into conduction and information can be stored.

Voltage is applied to the first interconnect 401 selected by the column decoder 410, the first floating conductive layer (floating conductive layer 15) of the first switching unit 101 connected to the column is charged, and gate voltage is applied to the second interconnect 402 selected by the row decoder 420, and thereby the first switching unit 101 at the prescribed position is forced into conduction. Next, a conduction state of the second switching unit 102 connected to the second interconnect 402 selected by the row decoder 420 and the third interconnect 403 selected by the column decoder 410 is detected, and thereby information can be read out.

Based on the circuit 254 according to the embodiment, a low consumption power non-volatile memory circuit having a simple configuration can be realized. This circuit 254 can be applied, particularly, to a non-volatile memory unit of FPGA (Field Programmable Gate Array).

The first switching unit 101 and the second switching unit 102 included in the circuit 254 may be disposed in the same plane parallel to the major surface of the base substance 2 and may be stacked in a direction perpendicular to the major surface of the base substance 2. When the first switching unit 101 and the second switching unit 102 are placed in the same plane parallel to the major surface of the base substance 2, a size of one memory element can be 12 $F^2$. On the other hand, when the switching unit 101 and the second switching unit 102 is stacked in the direction perpendicular to the major surface of the base substance 2, a size of one memory element can be 8 $F^2$. Thus, according to the circuit 254, a high-density memory can be realized.

A circuit including the switch device (switching unit) according to the embodiments can be used as a circuit used for at least part of at least one of the above column decoder 410 and the row decoder 420.

Sixth Embodiment

Figures 21A, 21B:
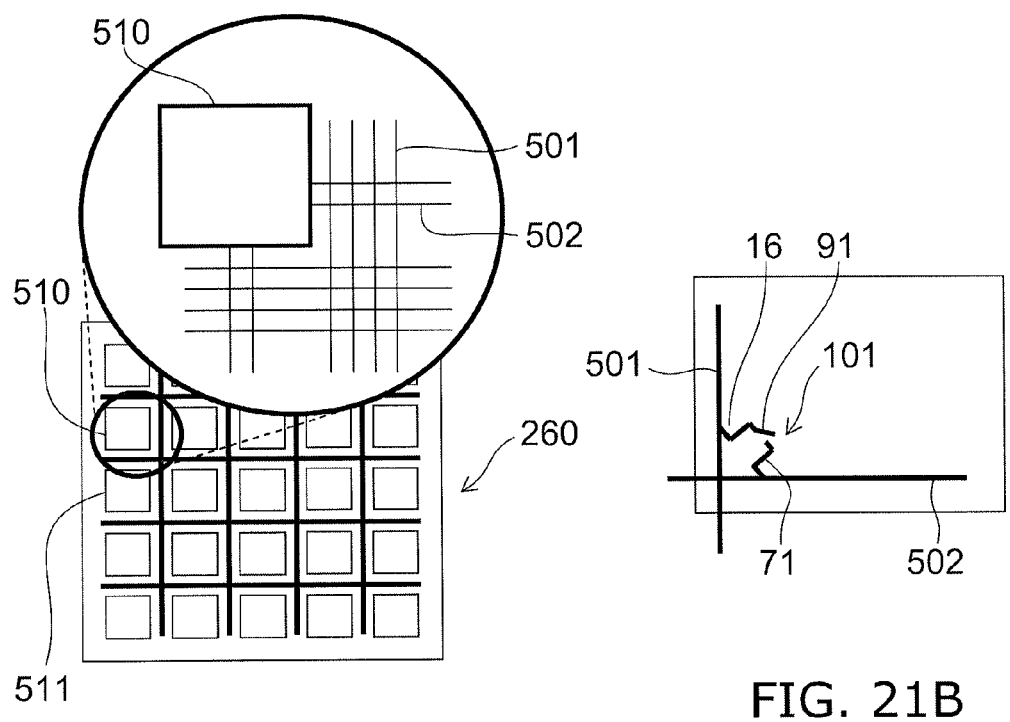
FIGS. 21A and 21B are schematic views showing a circuit including the switch devices.

FIGS. 21A and 21B are schematic views illustrating the configuration of a switch circuit according to a sixth embodiment.

In other words, FIG. 21A is a circuit diagram illustrating the whole configuration of the switch circuit 260 according to the embodiment, and FIG. 21B illustrates one of elements included in the switch circuit 260.

As shown in FIGS. 21 and 21B, the switch circuit 260 according to the embodiment further includes a logic circuit 510 provided on the base substance 2 and a plurality of interconnects (for example, first interconnect 501 and second interconnect 502) connected to the logic circuit 510.

The first switching unit 101 is connected to at least two interconnects (for example, first interconnect 501 and second interconnect 502) of the plurality of interconnects. The first switching unit 101 controls electrical connection between at least two interconnects (first interconnect 501 and the second interconnect 502).

In the specific example, the first interconnect 502 and the second interconnect 502 extend in directions nonparallel to each other, the first switching unit 101 is provided in a facing portion of the first interconnect 501 and the second interconnect 502. The illustrative first supporting electrode (supporting electrode 16) of the first switching unit 101 is connected to the first interconnect 501. The first contact point electrode (contact point electrode 71) of the first switching unit 101 is connected to the second interconnect 502. The first interconnect 501 and the second interconnect 502 are electrically connected, alternatively can be controlled to be electrically insulated by applying an electrical signal to the first control electrode (control electrode 91) of the first switching unit 101.

The switch circuit 260 can include a plurality of logic circuit units, namely can further include a second logic circuit unit 511 in addition to the above logic circuit unit 510. At least one of the above plurality of interconnects (for example, first interconnect 501 and the second interconnect 502) is provided between the above logic circuit unit 510 and the second logic circuit unit 511, and can be electrically connected to the logic circuit unit 510 and the second logic circuit unit 511.

At this time, the first interconnect 501 and the second interconnect 502 are electrically connected, alternatively are controlled to be electrically insulated by the switching operation of the first switching unit 101, and then the connection between the above logic circuit unit 510 and the second logic circuit unit 511 is changed.

The configuration of the above logic circuit unit 510 and the second logic circuit unit 511 is arbitrary, and for example, at least one of the logic circuit unit 510 and the second logic circuit unit 511 may be based on a CMOS logic block, and may be based on the logic circuit to which the switch device according to the embodiment is applied.

According to the circuit 260 of the embodiment, electrical connection state of the plurality of interconnects connecting the plurality of logic circuit units can be changed by using the switching unit 101. That is, the circuit 260 is an integrated circuit of configuration memory of FPGA.

In the circuit 260, one of the switch devices according to the embodiments is used as the first switching unit 101 serving as a cross point switch, and the first switching unit 101 can perform the non-volatile switching operation.

Thereby, the connection state between the logic circuit units can be changed, and a configuration memory having a simple configuration can be realized.

When a CMOS circuit is used as a cross point switch, a lot of transistors are needed, a device size is large and power consumption becomes large. Because of high on resistance, delay occurs.

On the contrary, in the circuit 260 according to the embodiment, one of the switch devices according to the embodiments is used as a cross point switch, and thus a device size can be reduced, power consumption is reduced and furthermore speeding up becomes possible.

The embodiment has been described with reference to specific examples. However, the invention is not limited to these specific examples. For instance, the specific configurations of the components constituting the supporting electrode forming the switching unit and the switch device, the facing supporting part, the contact point electrode, the facing contact point electrode, the control electrode, the facing control electrode, the beam, the holding part, the facing holding part, the movable part, the insulating part, the floating conductive layer or the like can be suitably selected from conventional ones by those skilled in the art, and such configurations are encompassed within the scope of the invention as long as they can also implement the invention and achieve similar effects.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the switch device and the circuit including the switch device described above in the embodiments of the invention, and any switch device and the circuit including the switch device thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A switch device comprising:
a first switching unit provided on a base,
the first switching unit including:
    a first supporting electrode fixed to the base;
    a first beam including:
        a first holding part fixed to the base, electrically connected to the first supporting electrode, and including metal-carbidized multilayer graphene; and
        a first movable part having one end connected to the first holding part, separated from the base and including multilayer graphene;
    a first contact point electrode fixed to the base and facing the first movable part;
    a first floating conductive layer fixed to the first movable part via a first insulating part and storing a charge; and
    a first control electrode fixed to the base and facing the first floating conductive layer.

2. The device according to claim 1, wherein the first control electrode puts the first movable part into a contact state or a non-contact state to the first contact point electrode by an applied first electrical signal.

3. The device according to claim 1, wherein the first switching unit further includes a first contact electrode provided between the first movable part and the first insulating part.

4. The device according to claim 2, wherein a portion of the first movable part to which the first floating conductive layer is fixed is metal-carbidized.

5. The device according to claim 4, wherein a first facing holding part connected to another end of the first movable part is fixed to the base and includes the metal-carbidized multilayer graphene.

6. The device according to claim 5, wherein the first switching unit further includes a first facing supporting part fixed to the base, fixing the first facing holding part and being conductive, and an insulating film provided between the first facing supporting part and the first facing holding part.

7. The device according to claim 5, wherein
the first floating conductive layer is annexed to the first movable part between the first holding part and the first facing holding part, and
a contact point part being in contact with the first contact point electrode includes the metal-carbidized multilayer graphene.

8. The device according to claim 1, wherein
the first floating conductive layer is annexed to an end of the first beam on an opposite side to the first holding part, and
the first contact point electrode is in contact with the first movable part between the first holding part and the first floating conductive layer.

9. The device according to claim 1, wherein a charge is injected into the first floating conductive layer by a tunnel current passing through the first insulating part.

10. The device according to claim 1, wherein a charge is injected into the first floating conductive layer by electron irradiation.

11. The device according to claim 2, further comprising:
a second switching unit provided on the base,
the second switching unit including:
    a second supporting electrode fixed to the base;
    a second beam including:
        a second holding part fixed to the base, electrically connected to the second supporting electrode and including the metal-carbidized multilayer graphene; and
        a second movable part having one end connected to the second holding part, separated from the base and including the multilayer graphene;
    a second contact point electrode fixed to the base and facing the second movable part;
    a second floating conductive layer fixed to the second movable part via a second insulating part and storing a charge; and
    a second control electrode fixed to the base, facing the second floating conductive layer, and putting the second movable part into a contact state or a non-contact state to the second contact point electrode by an applied second electrical signal,
the first movable part being separated from the first contact point electrode when the first electrical signal is not applied to the first control electrode, and
the second movable part contacting the second contact point electrode when the second electrical signal is not applied to the second control electrode.

12. The device according to claim 1, wherein
the first switching unit further includes
a first facing contact point electrode fixed to the base and facing the first movable part at another end of the first movable part, and
a first facing control electrode fixed to the base, facing the first floating conductive layer at the another end of the first movable part, and putting the first movable part into a contact state or a non-contact state to the first facing contact point electrode by an applied first facing electrical signal.

13. The device according to claim 12, wherein
the device is controlled by the first facing electrical signal applied to the first facing control electrode, and one of potential of the first contact point electrode and potential of the first facing contact point electrode is output from the first supporting electrode.

14. The device according to claim 12, wherein
the device is controlled by the first facing electrical signal applied to the first facing control electrode, and
an electrical signal input to the first supporting electrode is output from one of the first contact point electrode and the first facing contact point electrode.

15. The device according to claim 1, wherein the first floating conductive layer is provided in the same plane as a plane in which the first movable part is provided along an extending direction of the first beam.

16. The device according to claim 15, wherein the first floating conductive layer includes the metal-carbidized multilayer graphene.

17. A circuit comprising:
a first switching unit provided on a base; and
a second switching unit provided on the base,
the first switching unit including:
a first supporting electrode fixed to the base;
a first beam including:
a first holding part fixed to the base, electrically connected to the first supporting electrode, and including metal-carbidized multilayer graphene; and
a first movable part having one end connected to the first holding part, separated from the base and including multilayer graphene;
a first contact point electrode fixed to the base and facing the first movable part;
a first floating conductive layer fixed to the first movable part via a first insulating part and storing a charge; and
a first control electrode fixed to the base, facing the first floating conductive layer, and putting the first movable part into a contact state or a non-contact state to the first contact point electrode by an applied first electrical signal, and
the second switching unit including:
a second supporting electrode fixed to the base;
a second beam including:
a second holding part fixed to the base, electrically connected to the second supporting electrode and including the metal-carbidized multilayer graphene; and
a second movable part having one end connected to the second holding part, separated from the base and including the multilayer graphene;
a second contact point electrode fixed to the base and facing the second movable part;
a second floating conductive layer fixed to the second movable part via a second insulating part and storing a charge; and
a second control electrode fixed to the base, facing the second conductive layer, and putting the second movable part into a contact state or a non-contact state to the second contact point electrode by an applied second electrical signal,
a first elastic force of the first movable part being larger than a first van del Waal's force configured to operate between the first movable part and the first contact point electrode when the first movable part and the first contact point electrode contact each other, and
a second elastic force of the second movable part being smaller than a van del Waal's force configured to operate between the second movable part and the second contact point electrode when the second movable part and the second contact point electrode contact each other.

18. The circuit according to claim 17, wherein the first switching unit is connected to the second switching unit in parallel.

19. The circuit according to claim 17, wherein the first switching unit is connected to the second switching unit in series.

20. The circuit according to claim 17, wherein the first switching unit and the second switching unit are stacked on the base.

21. A circuit comprising:
a logic circuit unit provided on a base;
a plurality of interconnects connected to the logic circuit unit; and
a first switching unit connected to at least two interconnects of the plurality of interconnects and configured to control electrical connection between the at least two interconnects,
the first switching unit including:
a first supporting electrode fixed to the base;
a first beam including:
a first holding part fixed to the base, electrically connected to the first supporting electrode, and including metal-carbidized multilayer graphene; and
a first movable part having one end connected to the first holding part, separated from the base and including multilayer graphene;
a first contact point electrode fixed to the base and facing the first movable part;
a first floating conductive layer fixed to the first movable part via a first insulating part and storing a charge; and
a first control electrode fixed to the base and facing the first floating conductive layer.

* * * * *